(12) United States Patent
Matsubara et al.

(10) Patent No.: US 9,478,724 B2
(45) Date of Patent: Oct. 25, 2016

(54) N-TYPE THERMOELECTRIC MATERIAL

(71) Applicant: KABUSHIKI KAISHA TOYOTA CHUO KENKYUSHO, Nagakute-shi, Aichi-ken (JP)

(72) Inventors: Masato Matsubara, Nagakute (JP); Ryoji Asahi, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 99 days.

(21) Appl. No.: 14/584,864

(22) Filed: Dec. 29, 2014

(65) Prior Publication Data
US 2015/0200346 A1    Jul. 16, 2015

(30) Foreign Application Priority Data

Jan. 16, 2014 (JP) ................. 2014-005766
Dec. 12, 2014 (JP) ................. 2014-252207

(51) Int. Cl.
| H01L 35/18 | (2006.01) |
| H01L 35/34 | (2006.01) |
| C22C 1/04 | (2006.01) |
| C22C 12/00 | (2006.01) |
| C22C 19/07 | (2006.01) |

(52) U.S. Cl.
CPC .............. *H01L 35/34* (2013.01); *C22C 1/04* (2013.01); *C22C 12/00* (2013.01); *C22C 19/07* (2013.01); *H01L 35/18* (2013.01); *B22F 2998/10* (2013.01)

(58) Field of Classification Search
CPC ....................................................... H01L 35/18
See application file for complete search history.

(56) References Cited

U.S. PATENT DOCUMENTS 7,723,607 B2 *  5/2010 Subramanian ....... C01G 51/006
                                                                                       135/240
2010/0294326 A1 * 11/2010 Guo ........................... B22F 3/14
                                                                                       136/238

FOREIGN PATENT DOCUMENTS

| JP | 2002026400 A | 1/2002 |
| JP | 2007523998 A | 8/2007 |
| JP | 2008159680 A | 7/2008 |
| WO | 2005057673 A1 | 6/2005 |
| WO | 2009093455 A1 | 7/2009 |

OTHER PUBLICATIONS

Zhang et al. "Great Thermoelectric Power Factor Enhancement of CoSb3 Through the Lightest Metal Element Filling" Applied Physics Letters, (2011) vol. 98, pp. 072109-1 to 072109-3.
Chen et al. "Anomalous Barium Filling Fraction and N-Type Thermoelectric Performance of Ba y Co 4 Sb 12" Journal of Applied Physics, (Aug. 15, 2001) vol. 90, No. 4, pp. 1864-1868.
Nolas et al. "Thermoelectric Properties of Sn-Filled Skutterudites" Applied Physics Letters, (Jul. 3, 2000) vol. 77, No. 1, pp. 52-54.
Sales et al. "Thermoelectric Properties of Thallium-Filled Skutterudites" Physical Review B, (Jan. 15, 2000) vol. 61, No. 4, pp. 2475-2481.
Nolas et al. "Transport Properties of Germanium-Filled CoSb3," Applied Physics Letters, (Jun. 21, 2004) vol. 84, No. 25, pp. 5210-5212.
Shi, et al., "Multiple-Filled Skutterudites: High Thermoelectric Figure of Merit Through Separately Optimizing Electrical and Thermal Transports", Journal of the American Chemical Society, vol. 133, No. 20, pp. 7837-7846, 2011.

\* cited by examiner

*Primary Examiner* — Carol M Koslow
(74) *Attorney, Agent, or Firm* — Oliff PLC

(57) ABSTRACT

The n-type thermoelectric material has a composition represented by $(A_aB_bC_cD_t)Co_{4-y}Fe_ySb_{12}$. In the composition, $0 \le a \le 0.5$, $0 \le b \le 0.7$, $0 < c \le 0.5$, $a+b+c+t=x$, $0.4 \le x \le 1.0$, $0 \le y \le 0.5$, $a+b>0$; Element A is Mg, Ca, Sr and/or Ba; Element B is Y, Sc and/or La to Lu; Element C is Al, Ga and/or In; and Element D is Zn and/or Ti. The $A_aB_bC_cD_t$ $(=R_x)$ satisfies $R_x=[Ba_dA'_{1-d}]_a[Yb_eB'_{1-e}]_b[In_fC'_{1-f}]_cD_t$. In the formula, $0 < d \le 1$, $0 \le e \le 1$, $0 < f \le 1$, $ad+be>0$; Element A' is the element A other than Ba; Element B' is the element B other than Yb; and Element C' is the element C other than In. The n-type thermoelectric material contains five or more kinds in total of the element A to the element D.

17 Claims, 11 Drawing Sheets

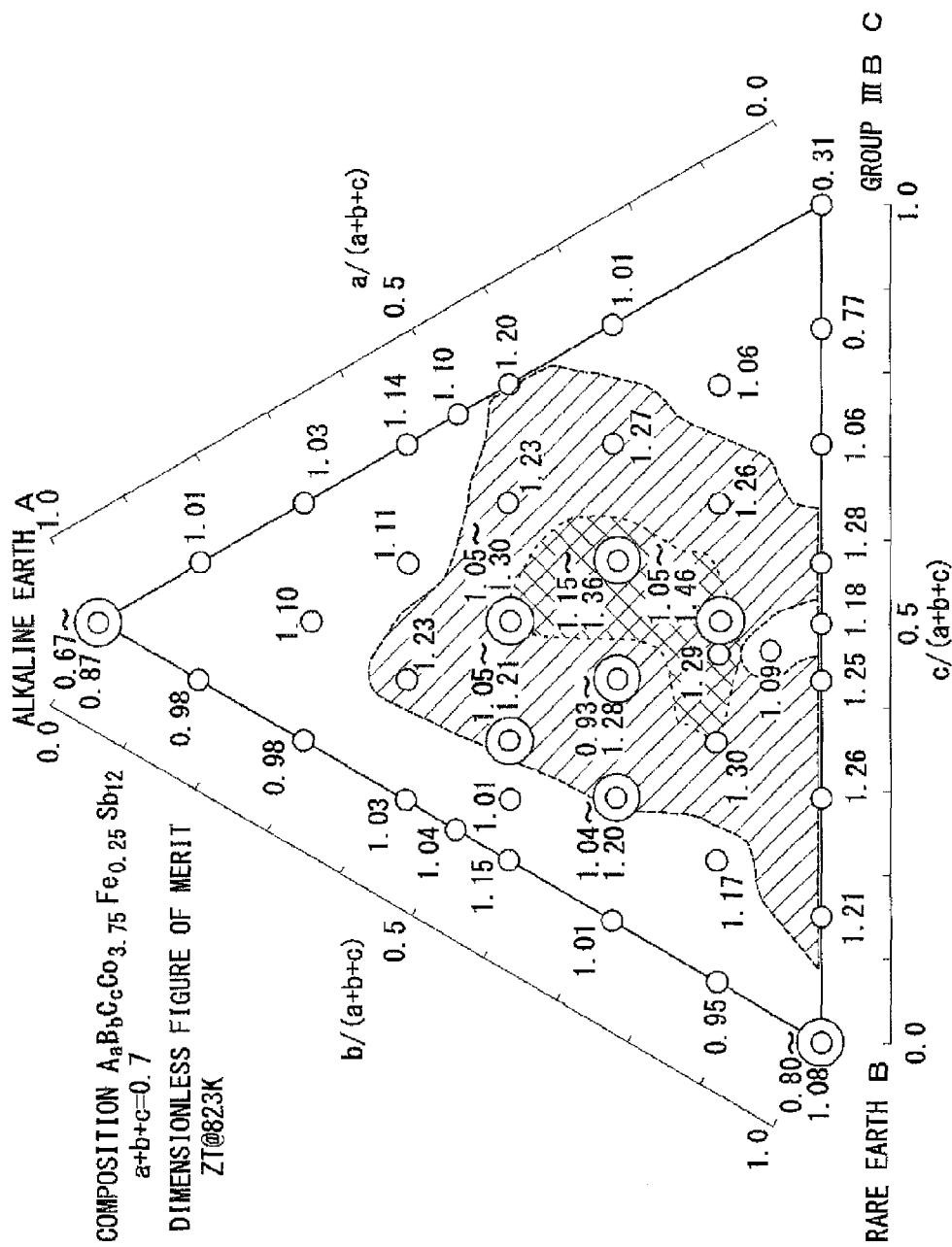

N-TYPE THERMOELECTRIC MATERIAL

TECHNICAL FIELD

The present invention relates to an n-type thermoelectric material, and more specifically to an n-type thermoelectric material including a filled skutterudite ($R_xCo_4Sb_{12}$)-based compound.

BACKGROUND OF THE INVENTION

The thermoelectric material is a material which is capable of converting directly thermal energy into electric energy, and its conversion efficiency has a correlation with the following dimensionless figure of merit ZT.

$$ZT=[(\sigma \times S^2)/\kappa] \times T = [PF/\kappa] \times T$$

($\sigma$: Electric conductivity, S: Seebeck coefficient, $\kappa$: Thermal conductivity, T: Absolute temperature)

To increase this ZT, the thermal conductivity $\kappa$ needs to be decreased.

The filled skutterudite ($R_xCo_4Sb_{12}$)-based material ($0<x\leq1$) is a kind of thermoelectric material having a crystal structure in which a cage formed by Co and Sb is filled with a filling element R in a central portion thereof. The filling element R charged in the cage vibrates at a natural frequency, and is capable of decreasing the thermal conductivity $\kappa$ by scattering lattice vibration resonantly (rattling effect). Moreover, $Co_4Sb_{12}$ containing no filling element R is a p-type thermoelectric material, but the filling element R is an electron donor dopant. Accordingly, filled skutterudite $R_xCo_4Sb_{12}$ is an n-type semiconductor.

As these filling elements R, various elements such as alkali metal elements (Non-patent Literature 1), alkaline earth metal elements (Non-patent Literature 2), rare earth elements (Patent Literature 1), group IIIB elements (Patent Literature 2), and other elements (Non-patent Literatures 3 to 5) have been suggested. In addition, as the number of filling elements is increased from one to two or three (multiple filling), the thermal conductivity $\kappa$ decreases, and therefore ZT can be increased. In general, high-performance n-type multiple-filled skutterudite does not contain Fe which substitutes Co site, has an amount x of the filling element of 0.3 or lower, and has the number of the filling element of three or lower (Non-patent Literature 6).

Fe-substituted system, for example, has been reported in Patent Literature 3. However, the filling elements R are only Yb and alkaline earth metal elements, and the amount x of the filling element of the composition which is specifically disclosed as an Example is 0.4 or lower.

Patent Literature 4 discloses an n-type skutterudite material which contains five kinds of filling elements R (Ca, Yb, Al, Ga, In) and has the amount x of the filling element of 0.4 to 0.9, and in which some of Co sites have been substituted with Fe.

That is, there is no example of reports concerning an n-type thermoelectric material including a filled skutterudite-based compound in which more than five kinds of the filling elements are contained, the filling elements R are added at a high concentration and the concentration of a carrier has been adjusted with Fe.

CITATION LIST

Patent Literature

Patent Literature 1: Japanese Unexamined Patent Application Publication No. 2002-026400

Patent Literature 2: Japanese Unexamined Patent Application Publication (Translation of PCT Application) No. 2007-523998

Patent Literature 3: Japanese Unexamined Patent Application Publication No. 2008-159680

Patent Literature 4: International Publication WO2009/093455

Non-Patent Literature

Non-patent Literature 1: Appl. Phys. Lett. 98 072109 (2011)
Non-patent Literature 2: Journal of Applied Physics Vol. 90(4) 1864 (2001)
Non-patent Literature 3: Appl. Phys. Lett. 84 5210 (2004)
Non-patent Literature 4: Appl. Phys. Lett. 77 52 (2000)
Non-patent Literature 5: Phys. Rev. B61 2475 (2000)
Non-patent Literature 6: Journal of American Chemical Society, xxxx, xxx, 000-000

SUMMARY OF THE INVENTION

A problem to be solved by the present invention is to provide a novel n-type thermoelectric material including a filled skutterudite ($R_xCo_4Sb_{12}$)-based compound.

Moreover, another problem to be solved by the present invention is to optimize, in an n-type thermoelectric material including a filled skutterudite ($R_xCo_4Sb_{12}$)-based compound, the kinds and amounts of the filling elements R and the amount of Fe substitution, to thereby realize a high-performance thermoelectric material.

In order to solve the above objects, a first aspect of the n-type thermoelectric material according to the present invention has the following configurations (1) to (3):

(1) The n-type thermoelectric material has a composition represented by the formula (X) below:

$$(A_aB_bC_cD_t)Co_{4-y}Fe_ySb_{12} \quad (X)$$

wherein $0\leq a\leq0.5$, $0\leq b\leq0.7$, $0<c\leq0.5$, $0\leq t\leq0.1$, $a+b+c+t=x$, $0.4\leq x\leq1.0$, $0\leq y\leq0.5$, $a+b>0$, the element A (the filling element A) is one or more elements selected from the group consisting of Mg, Ca, Sr and Ba, the element B (the filling element B) is one or more elements selected from the group consisting of Y, Sc and La to Lu, the element C (the filling element C) is one or more elements selected from the group consisting of Al, Ga and In, and the element D (the filling element D) is Zn and/or Ti;

(2) the $A_aB_bC_cD_t$ ($=R_x$) satisfies formula (Y) below:

$$R_x=[Ba_dA'_{1-d}]_a[Yb_eB'_{1-e}]_b[In_fC'_{1-f}]_cD_t \quad (Y)$$

wherein $0<d\leq1$, $0\leq e\leq1$, $0<f\leq1$, $ad+be>0$, the element A' is the filling element A other than Ba, the element B' is the filling element B other than Yb, and the element C' is the filling element C other than In; and (3) the n-type thermoelectric material contains five or more kinds in total of the filling elements A to D.

A second aspect of the n-type thermoelectric material according to the present invention has the following configurations (1') to (3'):

(1') the n-type thermoelectric material has a composition represented by formula (X') below:

$$(A_aB_bC_cD_t)Co_{4-y}Fe_ySb_{12} \quad (X')$$

wherein $0.1\leq a\leq0.3$, $0.1\leq b\leq0.6$, $0.1\leq c\leq0.4$, $0\leq t\leq0.1$, $a+b+c+t=x$, $0.5\leq x\leq1.0$, $0\leq y\leq0.4$, the element A (the filling element A) is one or more elements selected from the group consisting of Ca, Sr and Ba, the element B (the filling element B) is one or more elements selected from the group consisting of Y, Sc and La to Lu, the element C (the filling element C) is one or more elements selected from the group consisting of Al, Ga and In, and the element D (the filling element D) is Zn and/or Ti;

(2') the $A_a B_b C_c D_t$ (=$R_x$) satisfies formula (Y') below:

$$R_x = [Ba_d A'_{1-d}]_a [Yb_e B'_{1-e}]_b [In_f Ga_g Al_{1-f-g}]_c D_t \quad (Y')$$

wherein $0.1 \le ad \le 0.2$, $0.1 \le be \le 0.3$, $0 < f < 1$, $0 \le cg \le 0.15$, $f + g \le 1$, the element A' is the filling element A other than Ba, and the element B' is the filling element B other than Yb; and (3') the n-type thermoelectric material contains six or more kinds in total of the filling elements A to D.

The introduction of the filling elements R into the skutterudite-based compound effectively affects an improvement in the electric conductivity σ and a reduction in the thermal conductivity κ, but the degree of affecting varies depending on the kind of the filling elements R. Accordingly, by adding multiple filling elements R having different effects in combination, and at the same time substituting some of Co sites with Fe as a hole dopant, the concentration of the carrier is optimized, and the thermal conductivity κ is reduced. As a result, the thermoelectric property is improved.

BRIEF DESCRIPTION OF THE DRAWINGS

FIG. 11 is a drawing which shows the relationship between the composition of $R_x Co_{4-y} Fe_y Sb_{12}$ and dimensionless figure of merit ZT.

DETAILED DESCRIPTION OF THE PREFERRED EMBODIMENTS

Figure 1:
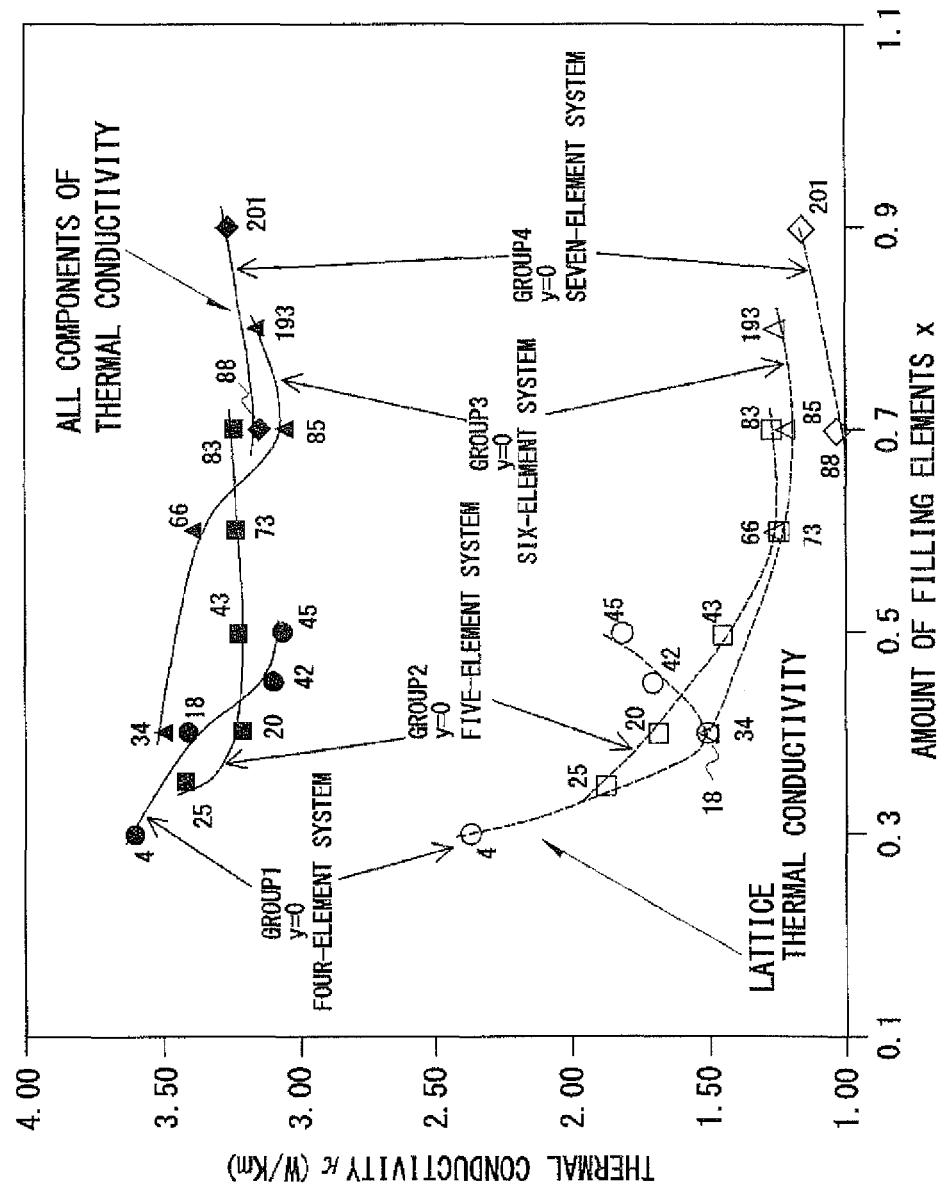
FIG. 1 is a drawing which shows the influence of the amount x of the filling element on the thermal conductivity κ of $R_x Co_{4-y} Fe_y Sb_{12}$.

Embodiments of the present invention will be described below in detail.

[1. n-Type Thermoelectric Material (1)]

The n-type thermoelectric material according to a first embodiment of the present invention has the following configurations (1) to (3):

(1) the n-type thermoelectric material has a composition represented by formula (X) (condition (1)) below:

$$(A_a B_b C_c D_t) Co_{4-y} Fe_y Sb_2 \quad (X)$$

wherein $0 \le a \le 0.5$, $0 \le b \le 0.7$, $0 < c \le 0.5$, $0 \le t \le 0.1$, $a+b+c+t = x$, $0.4 \le x \le 1.0$, $0 \le y \le 0.5$, $a+b > 0$, the element A (the filling element A) is one or more elements selected from the group consisting of Mg, Ca, Sr and Ba, the element B (the filling element B) is one or more elements selected from the group consisting of Y, Sc and La to Lu, the element C (the filling element C) is one or more elements selected from the group consisting of Al, Ga and In, and the element D (the filling element D) is Zn and/or Ti;

(2) the $A_a B_b C_c D_t$ (=$R_x$) satisfies the formula (Y) (condition (2)) below:

$$R_x = [Ba_d A'_{1-d}]_a [Yb_e B'_{1-e}]_b [In_f C'_{1-f}]_c D_t \quad (Y)$$

wherein $0 < d \le 1$, $0 \le e \le 1$, $0 < f \le 1$, $ad + be > 0$, the element A' is the filling element A other than Ba, the element B' is the filling element B other than Yb, and the element C' is the filling element C other than In; and (3) the n-type thermoelectric material contains five or more kinds in total of the filling elements A to D (condition (3)).

[1.1. Filled Skutterudite]

The n-type thermoelectric material according to the present invention includes a filled skutterudite-based compound ($R_x Co_{4-y} Fe_y Sb_{12}$) as a main component. The filling elements R are charged in the cage formed by Co and Sb. The filling elements R are electron dopants, and effectively affect the improvement in the electric conductivity σ and a reduction in the thermal conductivity κ, but the degree of affecting varies depending on the kind of element. In contrast, Fe, which substitutes Co sites, is a hole dopant. Accordingly, by adding multiple filling elements R having different effects in combination, and simultaneously substituting some of Co sites with Fe, the concentration of the carrier is optimized, and the thermal conductivity κ is reduced. As a result, the thermoelectric properties are improved.

[1.2. Filling Elements]

[1.2.1. Kind of Filling Elements]

In this embodiment, the filling elements R are constituted by:

(1) the filling element A consisting of alkaline earth metal elements (Mg, Ca, Sr and Ba);

(2) the filling element B consisting of rare earth elements (Y, Sc and La to Lu), (3) the filling element C consisting of group IIIB element (Al, Ga and In), and, (4) the filling element D consisting of transition metal elements (Zn and Ti) other than Fe and rare earth elements.

The n-type thermoelectric material may contain a single kind of the filling element A, or may contain two or more kinds of filling elements A. The same applies to filling elements B, C and D.

In this embodiment, the n-type thermoelectric material contains five or more kinds in total of filling elements A to D. The n-type thermoelectric material preferably contains five or more kinds in total of filling elements A to C. In general, the thermoelectric property is improved with increase in the kinds of filling elements R. The kinds of the filling elements R are, more preferably, six or more kinds, and more preferably, seven or more kinds.

Moreover, in this embodiment, the n-type thermoelectric material preferably contains, as the filling elements R, at least Ba and In. In addition, the n-type thermoelectric material preferably contains, as the filling elements R, at least Ba, Yb and In. In these cases, as for the rest of the filling elements R, optimal elements can be selected depending on the purpose.

[1.2.2. Amounts of Filling Elements]

In formula (X), "a" represents the amount of the filling element A (atomic ratio). In this embodiment, the filling element A is not an essential element. That is, it suffices when $a \geq 0$. In general, the thermoelectric property is improved with increase in the amount of the filling element A. In particular, the element A contributes to an improvement in the electric conductivity $\sigma$. Within a certain range, the electric conductivity $\sigma$ becomes higher with increase in the amount of the element A. As a result, the power factor PF and ZT are improved. "a" is preferably $a \geq 0.1$.

In contrast, when the amount of the filling element A is excessively large, it becomes difficult to achieve an increase in the power factor PF and a reduction in the thermal conductivity $\kappa$ at the same time. In particular, since the electric conductivity $\sigma$ becomes too high, the carrier component of the thermal conductivity $\kappa$ increases, and thus ZT lowers. Therefore, it is necessary that $a \leq 0.5$. "a" is preferably $a \leq 0.4$.

In formula (X), "b" represents the amount of the filling element B (atomic ratio). In this embodiment, the filling element B is not an essential element. That is, it suffices when $b \geq 0$. In general, the thermoelectric property is improved with increase in the amount of the filling element B. In particular, the element B suitably improves the electric conductivity $\sigma$, and effectively decreases the thermal conductivity $\kappa$. "b" is preferably $b \geq 0.1$, and more preferably $b \geq 0.2$.

In contrast, when the amount of the filling element B is excessively large, it becomes difficult to achieve an increase in the power factor PF and a reduction in the thermal conductivity $\kappa$ at the same time. Therefore, it is necessary that $b \leq 0.7$. "b" is preferably $b \leq 0.6$.

In formula (X), "a+b>0" represents that at least one of the element A and the element B is contained. When the element A or the element B is contained in addition to the element C, high thermoelectric properties can be obtained.

In formula (X), "c" represents the amount of the filling element C (atomic ratio). In this embodiment, In is an essential element. Therefore, it is necessary that $c > 0$. In general, the thermoelectric property is improved with increase in the amount of the filling element C. In particular, the element C contributes to a reduction in the thermal conductivity $\kappa$. As the amount of the element C increases, mainly the thermal conductivity $\kappa$ decreases, and thus ZT increases. "c" is preferably $c \geq 0.1$, and more preferably $c \geq 0.2$.

In contrast, when the amount of the filling element C becomes excessively large, it becomes difficult to achieve an increase in the power factor PF and a reduction in the thermal conductivity $\kappa$ at the same time. In particular, since the electric conductivity $\sigma$ decreases, ZT lowers. Therefore, it is necessary that $c \leq 0.5$. "c" is preferably $c \leq 0.4$.

In formula (X), "t" represents the amount of the filling element D (atomic ratio). In this embodiment, the filling element D is not an essential element. That is, it suffices when $t \geq 0$. Certain kinds of transition metal elements are almost as effective as rare earth elements.

In contrast, when the amount of the filling element D is excessively large, it becomes difficult to achieve an increase in the power factor PF and a reduction in the thermal conductivity $\kappa$ at the same time. Therefore, it is necessary that $t \leq 0.1$.

In formula (X), "x" represents the amount of the filling elements R (atomic ratio), that is, the total amount of filling elements A to D. The thermoelectric property is improved with increase in the amounts of filling elements R. In particular, as the value x increases, the electric conductivity $\sigma$ tends to increase and the lattice thermal conductivity $\kappa_{ph}$ tends to decrease. In order for such an effect to be obtained, it is necessary that $x \geq 0.4$. "x" is preferably $x \geq 0.5$.

In contrast, the amount of the filling elements R to be filled has a limit, and when the amounts of the filling elements R are beyond the limit, the filling elements R precipitate as heterogeneous phase. Therefore, it is necessary that $x \leq 1.0$. Moreover, when x becomes too large, the carrier component of the thermal conductivity $\kappa$ increases. Accordingly, the ZT value increases as x increases, and becomes maximum at a certain value x (around 0.7 to 0.8).

In formula (X), "y" represents the amount of Fe substituting Co sites (atomic ratio). Fe is not always necessary since an appropriate amount of electrons is doped depending on the kind and amount of filling elements A to D. That is, it suffices when $y \geq 0$.

In contrast, when the amount of Fe substitution is excessively large, the number of holes becomes too large. Accordingly, in the n-type thermoelectric material, the thermoelectric property is lowered on the contrary. Therefore, it is necessary that $y \leq 0.5$. "y" is preferably $y \leq 0.4$.

In formula (Y), "d" represents the amount (atomic ratio) of Ba in the filling element A. In this embodiment, when the filling element A is contained, Ba is an essential element. Therefore, it is necessary that $d > 0$.

In contrast, the n-type thermoelectric material may contain, as the filling element A, Ba only, or may contain alkaline earth metal elements other than Ba in addition to Ba. That is, it suffices when $d \leq 1$.

In formula (Y), "e" represents the amount (atomic ratio) of Yb in the filling element B. Yb is an element which acts significantly in improving the thermoelectric property, but in this embodiment, Yb is not an essential element. That is, it suffices when $e \geq 0$.

In contrast, the n-type thermoelectric material may contain, as the filling element B, Yb only, or may contain rare earth elements other than Yb in addition to or in place of Yb. That is, it suffices when $e \leq 1$.

In formula (Y), "ad+be>0" represents that at least one of Ba or Yb is contained. When Ba or Yb is contained in addition to the element C, a higher thermoelectric property is obtainable.

In formula (Y), "f" represents the amount (atomic ratio) of In in the filling element C. In this embodiment, In is an essential element. Therefore, it is necessary that $f > 0$.

In contrast, the n-type thermoelectric material may contain, as the filling element C, In only, or may contain group IIIB elements other than In in addition to In. That is, it suffices when $f \leq 1$.

[1.3. Preferable Composition]

In an n-type thermoelectric material which satisfies the conditions (1) to (3) described above, when the kinds and amounts of the filling elements R are optimized, the thermoelectric property is further improved. Specifically it is preferable that the n-type thermoelectric material has the following composition:

[1.3.1. Composition (1.1)]

It is preferable that the n-type thermoelectric material contains two or more kinds of filling elements selected from the group consisting of the element A, the element B, and the element C (composition (1.1)) in addition to satisfying the conditions (1) to (3) described above. In particular, the composition (1.1) preferably contains, as the filling elements R, an alkaline earth metal element, a rare earth element, and a group IIIB element.

The composition (1.1) is advantageous in the following points:

That is, as mentioned above, the element A mainly contributes to an increase in the electric conductivity $\sigma$ while the element C mainly contributes to a reduction in the thermal conductivity $\kappa$. Therefore, when the amount of one element is larger than that of the other, the thermoelectric property may be lowered in some cases. In contrast, when some of these elements are substituted with the element B, the balance between the electric conductivity $\sigma$ and the thermal conductivity $\kappa$ is varied, and the thermoelectric property may be improved in some cases.

For example, in a composition (see samples Nos. 150, 168, etc., described later) containing the element C and the element A only, the thermal conductivity $\kappa$ is low, but the electric conductivity $\sigma$ is low. Therefore, the power factor PF is low, and the ZT value is also low. In contrast, in a composition in which part of the element C is partially substituted with Yb (see samples Nos. 151, 169, etc.), the thermal conductivity $\kappa$ increases, but the ZT value improves since the power factor PF improves.

Moreover, on the contrary, when part of the element A is substituted with Yb (see samples Nos. 168→No. 151), power factor PF lowers, but the ZT value improves since the thermal conductivity $\kappa$ decreases.

[1.3.2. Composition (1.2)]

It is preferable that the n-type thermoelectric material described above further satisfies $0<b\leq0.6$ and $0.1\leq be\leq0.5$ (composition (1.2)) in addition to satisfying the conditions (1) to (3). "be" represents the amount (atomic ratio) of Yb. That is, the composition (1.2) contains, as the filling elements R, at least Yb and In. The composition (1.2) further preferably contains, as the filling elements R, one or more elements selected from the group consisting of Sc, Y, La, Pr, Sm, Eu, Gd, Ho, Er and Tm.

The composition (1.2) is advantageous in the following points:

(1) The composition (1.2) in which be $\geq0.1$ has a higher ZT value than a composition containing no Yb in some cases. For example, sample No. 150 includes a relatively large amount of the group IIIB elements. Therefore, the ZT value of the sample is low because the thermal conductivity is low, but the electric conductivity is also low. In the sample No. 168 in which a part of the group IIIB elements is substituted with alkaline earth elements, the electric conductivity and the ZT value are improved, but the thermal conductivity is increased. Similarly, in the case where a part of the group IIIB elements is substituted with Yb, the thermal conductivity is increased (sample No. 151), but the value is smaller than that of sample No. 168. Therefore, the composition containing Yb (sample No. 151) has a higher ZT value than the composition containing no Yb (samples Nos. 150, 168) in some cases. This is because Yb improves the electric conductivity as an electron dopant, and in addition thereto, increases the effect of reducing the thermal conductivity $\kappa$ by rattling due to its small ionic radius and heavy atomic weight.

(2) A composition containing Yb only as the filling element R has a ZT value not higher than 1.2, and ZT=1.19 near be=0.5 is the highest (see samples Nos. 35, 53, 105, 198, etc.). Moreover, in the composition b>0.6, there was not found a composition with ZT higher than 1.2 even though rare earth elements other than Yb were introduced.

In contrast, in compositions further containing elements other than rare earth elements (for example, with composition x=0.7, see samples Nos. 110 to 188, etc.), there were cases where the ZT values were higher than 1.2 in the range of $0<b\leq0.6$. For the composition b=0.6, it was found that there was a case where, when a=0 and c=0.1, the ZT value was higher than 1.2 (see sample No. 104). In addition, for the composition $0<b<0.6$, it was found that the ZT value was higher than 1.2 when the composition contained Yb, the filling elements B' other than Yb, and In, and the number of filling elements was six or more, except for sample No. 148 (when a=0.1 and c=0.1).

[1.3.3. Composition (1.3)]

It is preferable that the n-type thermoelectric material further satisfies, in addition to satisfying the conditions (1) to (3) described above, b=0, a>0, c>0, ad>0 and cf>0, the element A' contains Ca and/or Sr, and the element C' contains Al and/or Ga (composition (1.3)).

The composition (1.3) contains, as the filling elements R, at least Ba and In, but contains no rare earth element.

When two or more kinds of alkaline earth metal elements are contained (d<1), the composition (1.3) further contains Ca and/or Sr as the filling elements R.

When two or more kinds of group IIIB elements are contained (e<1), the composition (1.3) further contains Al and/or Ga as the filling elements R.

The composition (1.3) is advantageous in the following points:

That is, the electric conductivity $\sigma$ is increased by the doping of alkaline earth metal element, while the thermal conductivity $\kappa$ is decreased by the doping of group IIIB element. Accordingly, at the optimum composition, ZT value becomes 1.2 or higher (see sample No. 168, etc.).

[1.3.4. Composition (1.4)]

It is preferable that the n-type thermoelectric material further satisfies, in addition to satisfying the conditions (1) to (3) described above, $0.2\leq b\leq0.3$ and e>0, and contains one or more elements as the element B' (composition (1.4)). That is, the composition (1.4) contains, as the filling elements R, at least Yb, one or more elements B', and In.

The composition (1.4) is advantageous in the following points:

(1) Many of materials included in the composition (1.4) have ZT values higher than 1.2 (for example, see samples Nos. 73 to 77).

(2) Many of materials included in the composition (1.4) have ZT values higher than 1.3 (for example, see samples Nos. 78, 79, 114, 118, 119, 127, 131, 132, 138, 139, 141, 146)

[1.3.5. Composition (1.5)]

It is preferable that the n-type thermoelectric material further satisfies, in addition to satisfying the conditions (1) to (3) described above, $0.3<b\leq0.6$ and e>0, and contains two or more kinds of elements as the elements B' (composi- (1.5)). That is, the composition (1.5) contains, as the filling elements R, at least Yb, two or more kinds of elements B', and In.

The composition (1.5) is advantageous in the following points:

That is, the composition (1.5) has relatively high ZT values, and many of materials included in the composition (1.5) have ZT values higher than 1.3 (for example, see samples Nos. 189 to 192, 196 to 197, 203, 205).

[1.3.6. Composition (1.6)]

It is preferable that the n-type thermoelectric material further satisfies 0<a≤0.4 (composition (1.6)) in addition to satisfying the conditions (1) to (3) described above. That is, the composition (1.6) contains, as the filling elements R, at least Ba and In.

The composition (1.6) is advantageous in the following points:

That is, as in samples No. 39 (1873 S/cm)→No. 60 (1960 S/cm)→No. 80 (2230 S/cm), with increase in the amount of the alkaline earth metal elements, the electric conductivity σ increases. However, these have low performance since they do not contain In and are 0.4≤a. Moreover, even when In is contained, when 0.4<a, the ZT value has not reached 1.2 (for example, see sample No. 181, etc.). In contrast, in the composition in which part of the element A is substituted with other kinds of elements so that a≤0.4, the ZT value is higher than 1.2 (for example, see sample No. 178, or samples Nos. 180→No. 171, etc.).

[1.3.7. Composition (1.7)]

It is preferable that the n-type thermoelectric material further satisfies, in addition to satisfying the conditions (1) to (3) described above, 0.3≤a<0.4 and 0.1≤ad≤0.2, and contains Ca and Sr as the element A' (composition (1.7)). "ad" represents the amount (atomic ratio) of Ba.

That is, the composition (1.7) contains, as the filling elements R, at least Ba, Ca, Sr and In.

The composition (1.7) is advantageous in the following points:

That is, the composition (1.7) has relatively high ZT values, and many of materials included in the composition (1.7) have ZT values near 1.3 or higher than 1.3 (for example, see samples Nos. 171, 204 to 207).

[1.3.8. Composition (1.8)]

It is preferable that the n-type thermoelectric material further satisfies, in addition to satisfying the conditions (1) to (3) described above, a=0.4, b>0, c>0 and 0.1≤ad≤0.2, and contains Ca and Sr as the element A' (composition (1.8)). That is, the composition (1.8) contains, as the filling elements R, at least Ba, Ca, Sr, rare earth element and In.

The composition (1.8) is advantageous in the following points:

That is, the composition (1.8) can obtain a relatively high thermoelectric property, with a ZT value of 1.2 or higher (for example, see sample No. 178).

[1.3.9. Composition (1.9)]

It is preferable that the n-type thermoelectric material further satisfies 0.1≤c≤0.4 (composition (1.9)) in addition to satisfying the conditions (1) to (3) described above. That is, the composition (1.9) contains, as the filling elements R, at least In.

The composition (1.9) is advantageous in the following points:

That is, as in samples Nos. 100→No. 99→No. 98, with increase in "c", the thermal conductivity κ decreases. However, in the composition range 0.4<c, the ZT value does not reach 1.2 since the electric conductivity σ is insufficient. In contrast, for the samples in the composition range 0.1≤c≤0.4 (for example, see samples Nos. 101 to 104), their ZT values are all higher than 1.2.

[1.3.10. Composition (1.10)]

It is preferable that the n-type thermoelectric material further satisfies, in addition to satisfying the conditions (1) to (3) described above, 0.2≤c≤0.4, $C=In_fGa_gAl_{1-f-g}$, and satisfies 0<cg≤0.2 and 0≤(1−f−g)c≤0.1 (composition 1.10)). "cg" represents the amount (atomic ratio) of Ga. "(1−f−g)c" represents the amount (atomic ratio) of Al. That is, the composition (1.10) contains, as the filling elements R, at least In and Ga.

The composition (1.10) is advantageous in the following points:

That is, the composition (1.10) can decrease the thermal conductivity κ without greatly impairing the electric conductivity σ compared to the composition (1.9). Accordingly, many of materials included in the composition (1.10) have ZT values higher than 1.3 (for example, see samples Nos. 189 to 192, 196 to 197, 203, 205).

[1.4. Dimensionless Figure of Merit (ZT)]

As described above, by optimizing the kinds and amounts of the filling elements R, the dimensionless figure of merit (ZT) of the n-type thermoelectric material is improved. ZT is a function of temperature, and there is a temperature at which the highest ZT can be obtained. By optimizing the kinds and amounts of the filling elements R, the ZT value at 823 K becomes 1.3 or higher.

[2. N-Type Thermoelectric Material (2)]

The n-type thermoelectric material according to a second embodiment of the present invention has the following configurations (1') to (3'):

(1') the n-type thermoelectric material has a composition represented by the formula (X') (condition (1')) below:

$$(A_aB_bC_cD_t)Co_{4-y}Fe_ySb_{12} \quad (X')$$

wherein 0.1≤a≤0.3, 0.1≤b≤0.6, 0.1≤c≤0.4, 0≤t≤0.1, a+b+c+t=x, 0.5≤x≤1.0, 0≤y≤0.4, the element A (the filling element A) is one or more elements selected from the group consisting of Ca, Sr and Ba, the element B (the filling element B) is one or more elements selected from the group consisting of Y, Sc and La to Lu, the element C (the filling element C) is one or more elements selected from the group consisting of Al, Ga and In, and the element D (the filling element D) is Zn and/or Ti;

(2') the $A_aB_bC_cD_t$ (=$R_x$) satisfies the formula (Y') (condition (2')) below:

$$R_x=[Ba_dA'_{1-d}]_a[Yb_eB'_{1-e}]_b[In_fGa_gAl_{1-f-g}]_cD_t \quad (Y')$$

wherein 0.1≤ad≤0.2, 0.1≤be≤0.3,

0<f<1, 0≤cg≤0.15, f+g≤1, the element A' is the filling element A other than Ba, and the element B' is the filling element B other than Yb; and (3') the n-type thermoelectric material contains six or more kinds in total of the filling elements A to D (condition (3')).

[2.1. Filled Skutterudite]

Since the details of filled skutterudite-based compound are the same as those of the first embodiment, their explanation will be omitted.

[2.2. Filling Elements]
[2.2.1. Kinds of Filling Elements]

In this embodiment, the filling elements R are constituted by:

(1) the filling element A consisting of alkaline earth metal elements (Ca, Sr and Ba) other than Mg,
(2) the filling element B consisting of rare earth elements (Y, Sc and La to Lu),
(3) the filling element C consisting of group IIIB element (Al, Ga and In), and,
(4) the filling element D consisting of transition metal elements (Zn and Ti) other than Fe and rare earth elements.

In this embodiment, the n-type thermoelectric material contains six or more kinds in total of filling elements A to D. In general, the thermoelectric property is improved with increase in the kinds of filling elements R. The kinds of the filling elements R are preferably seven or more, more preferably, eight or more.

Moreover, in this embodiment, it is preferable that the n-type thermoelectric material contains, as the filling elements R, at least, two or more kinds of alkaline earth metal elements (Ba, A'), two or more kinds of rare earth elements (Yb, B'), and two or more kinds of group IIIB elements (In, (Ga, Al)). In these cases, optimal elements of the filling elements R other than Ba, Yb and In can be selected depending on the purpose.

[2.2.2. Amounts of Filling Elements]

In formula (X'), "a" represents the amount of the filling element A (atomic ratio). The thermoelectric property is improved with increase in the amount of the filling element A. In particular, the element A contributes to an improvement in the electric conductivity $\sigma$. Within a certain range, the electric conductivity $\sigma$ becomes higher with increase in the amount of the element A. As a result, the power factor PF and ZT are improved. In order for such an effect to be obtained, "a" is preferably a≥0.1.

In contrast, when the amount of the filling element A is excessively large, it becomes difficult to achieve an increase in the power factor PF and a reduction in the thermal conductivity $\kappa$ at the same time. In particular, since the electric conductivity $\sigma$ becomes too high, the carrier component of the thermal conductivity $\kappa$ increases, and thus ZT lowers. Therefore, "a" is preferably a≤0.3, and more preferably a≤0.2.

In formula (X'), "b" represents the amount of the filling element B (atomic ratio). The thermoelectric property is improved with increase in the amount of the filling element B. In particular, the element B suitably improves the electric conductivity $\sigma$, and effectively decreases the thermal conductivity $\kappa$. In order for such an effect to be obtained, "b" is preferably b≥0.1. "b" is more preferably b≥0.2.

In contrast, when the amount of the filling element B is excessively large, it becomes difficult to achieve an increase in the power factor PF and a reduction in the thermal conductivity $\kappa$ at the same time. Therefore, "b" is preferably b≤0.6, and more preferably b≤0.5.

In formula (X'), "c" represents the amount of the filling element C (atomic ratio). The thermoelectric property is improved with increase in the amount of the filling element C. In particular, the element C contributes to a reduction in the thermal conductivity $\kappa$. As the amount of the element C increases, the thermal conductivity $\kappa$ mainly decreases, and thus ZT increases. In order for such an effect to be obtained, "c" is preferably c≥0.1, and more preferably c≥0.2.

In contrast, when the amount of the filling element C becomes excessively large, it becomes difficult to achieve an increase in the power factor PF and a reduction in the thermal conductivity $\kappa$ at the same time. In particular, since the electric conductivity $\sigma$ decreases, ZT lowers. Therefore, "c" is preferably c≤0.4.

In formula (X'), "t" represents the amount of the filling element D (atomic ratio). Since the details of "t" are the same as those of the first embodiment, their explanation will be omitted.

In formula (X'), "x" represents the amounts of the filling elements R (atomic ratio), that is, the total amount of filling elements A to D. The thermoelectric property is improved with increase in the amounts of filling elements R. In particular, as the value x increases, the electric conductivity $\sigma$ tends to increase and the lattice thermal conductivity $\kappa_{ph}$ tends to decrease. In order for such an effect to be obtained, "x" is preferably x≥0.5.

In contrast, the amount of the filling elements R to be filled has a limit, and when the amount of the filling elements R becomes beyond the limit, the filling elements R precipitate as heterogeneous phase. Therefore, it is necessary that x≤1.0. Moreover, when x becomes too large, the carrier component of the thermal conductivity $\kappa$ increases. Accordingly, the ZT value increases as x increases, and becomes maximum at a certain value x (around 0.7 to 0.8).

In formula (X'), "y" represents the amount of Fe substituting Co sites (atomic ratio). Fe is not always necessary since an appropriate amount of electrons is doped depending on the combination and amounts of filling elements A to D. That is, it suffices when y≥0. "y" is preferably y>0.1.

In contrast, when the amount of Fe substitution is excessively large, the number of electron carriers becomes too small. Accordingly, in the n-type thermoelectric material, the thermoelectric property is lowered on the contrary. Therefore, "y" is preferably y≤0.4. "y" is more preferably y≤0.35, and still more preferably y<0.3.

In formula (Y'), "ad" represents the amount of Ba (atomic ratio). The thermoelectric property is improved with increase in the amount of Ba. In order for such an effect to be obtained, "ad" is preferably ad≤0.1.

In contrast, when the amount of Ba is excessively large, it becomes difficult to achieve an increase in the power factor PF and a reduction in the thermal conductivity $\kappa$ at the same time. Therefore, "ad" is preferably ad≤0.2.

In formula (Y'), "be" represents the amount (atomic ratio) of Yb. In general, the effect of reducing the thermal conductivity $\kappa$ by rattling is improved with decrease in the ionic radius of the filling elements and increase in the weight of the elements. Among the rare earth elements, Yb has the second smallest ionic radius and is the second heaviest element next to Lu. Accordingly, the effect of reducing the thermal conductivity $\kappa$ is improved with increase in the amount of Yb. In order for such an effect to be obtained, "be" is preferably be ≥0.1.

In contrast, when the amount of Yb is excessively large, it becomes difficult to achieve an increase in the power factor PF and a reduction in the thermal conductivity $\kappa$ at the same time. In particular, if the amount of Yb exceeds a solid solubility limit, Yb precipitates and sufficient rattling effects cannot be obtained. Therefore, "be" is preferably be≤0.3.

In formula (Y'), "f" represents the amount (atomic ratio) of In in the filling element C. In this embodiment, In is an essential element. Therefore, it is necessary that f>0.

Moreover, in this embodiment, the n-type thermoelectric material contains, as the filling element C, group IIIB elements other than In (Ga, Al). That is, it is necessary that f<1.

In formula (Y'), "cg" represents the amount (atomic ratio) of Ga. Ga is an element which acts significantly in improving the thermoelectric property, but in this embodiment, Ga is not an essential element. That is, it suffices when cg≥0. The effect of reducing the thermal conductivity κ decreases in the order of: Al>Ga>In. Therefore, when part of In is substituted with Ga (and/or Al), the thermal conductivity κ decreases, and the ZT value may be improved in some cases.

In contrast, when the amount of Ga is excessively large, it becomes difficult to achieve an increase in the power factor PF and a reduction in the thermal conductivity κ at the same time. In particular, the solid solubility increases in the order of: Al<Ga<In, and therefore when the amount of Ga (and/or, Al) is excessively large, Ga (and/or Al) precipitates, and the ZT value lowers on the contrary. Therefore, "cg" is preferably cg≤0.15.

In formula (Y'), "f+g" represents the sum of the amounts (atomic ratio) of In and Ga, and is correlated with the amount (atomic ratio) of Al. The n-type thermoelectric material according to the present invention may contain, as the filling element C, In and Ga only, or Al in addition to or in place of Ga. That is, it suffices when f+g≤1.

As described above, Al contributes to the reduction in the thermal conductivity κ. However, when the amount of Al is excessively large, the ZT value lowers on the contrary. Therefore, "f+g" is preferably f+g≥0.66.

[2.3. Preferable Composition]

In the n-type thermoelectric material which satisfies the conditions (1') to (3') described above, when the kind and amounts of the filling elements R are optimized, the thermoelectric property is further improved. Specifically, it is preferable that the n-type thermoelectric material has the following composition:

[2.3.1. Composition (2.1)]

It is preferable that the n-type thermoelectric material further satisfies, in addition to satisfying the conditions (1') to (3') described above, 0.7≤x<0.9 and 0≤y≤0.35 (composition (2.1)). In particular, it is preferable that the composition (2.1) contains six or more kinds in total of filling elements A to C.

"y" is more preferably 0<y≤0.35. Since thermal conductivity can be adjusted by setting y>0, there is a possibility that the ZT value is further improved.

The composition (2.1) is advantageous in the following points:

That is, the composition (2.1) has relatively high ZT values, and many of materials included in the composition (2.1) have ZT values higher than 1.3. In addition, among them, in an optimum composition, the ZT value may exceed 1.4 in some cases (for example, see samples Nos. 131 to 132, 189, 191 to 192, 203) as will be described later.

[2.3.2. Composition (2.2)]

It is preferable that the n-type thermoelectric material further satisfies, in addition to satisfying the conditions (1') to (3') described above, 0.9≤x and 0≤y≤0.4, and contains seven or more kinds in total of elements as the filling elements A to D (composition (2.2)). In particular, the composition (2.2) preferably contains seven or more kinds in total of filling elements A to C.

"y" is preferably 0<y≤0.4, and more preferably 0.1<y<0.3. Since thermal conductivity can be adjusted by setting y>0, there is a possibility that the ZT value is further improved.

The composition (2.2) is advantageous in the following points:

That is, the composition (2.2) has relatively high ZT values, and many of materials included in the composition (2.2) have ZT values higher than 1.3 (for example, see samples Nos. 203, 205).

[2.3.3. Composition (2.3)]

It is preferable that the n-type thermoelectric material further satisfies, in addition to satisfying the conditions (1') to (3') described above, 0.1≤a≤0.2, 0.2≤b≤0.5 and 0.2≤c≤0.4, and contains at least Ba, Yb, Eu, La, In and Ga as the filling elements A to D, and further contains Al if necessary (composition 2.3).

The composition (2.3) is advantageous in the following points:

(1) The composition (2.3) has relatively high ZT values, and many of materials included in the composition (2.3) have ZT values higher than 1.3 (for example, see samples Nos. 131, 132).

(2) By substituting part of In with Al, the thermal conductivity κ further decreases without impairing the power factor PF. Accordingly, compared to the case where no Al is present (in the case where the number of elements is 6), the ZT value is improved (for example, see samples Nos. 123→131). Moreover, by containing Eu, a high electric conductivity σ can be obtained. Accordingly, compared to the case where no Eu is contained, the power factor PF is improved, and the ZT value is further improved (for example, see samples Nos. 140→131). By these effects, the highest ZT value of 1.46 in Tables described later can be obtained.

[2.4. Dimensionless Figure of Merit (ZT)]

The details of the dimensionless figure of merit are the same as those in first embodiment, and therefore their explanation will be omitted.

[3. Method for Producing n-Type Thermoelectric Material]

The n-type thermoelectric material according to the present invention can be produced by:

(1) blending raw materials so that the n-type thermoelectric material according to the present invention can be obtained,
(2) melting and casting the raw materials blended,
(3) pulverizing the ingot obtained (or, powder produced by crushing the ingot) to produce powder, and
(4) sintering the powder obtained.

[3.1. Raw Material Blending Step]

First, raw materials are blended so that the n-type thermoelectric material according to the present invention can be obtained (raw material blending step).

The raw materials may be pure metals, or may be alloys containing two or more kinds of elements. The blending ratio of raw materials is acceptable as long as it allows an n-type thermoelectric material having a target composition to be obtained. Moreover, in order to prevent oxidation of raw materials, blending of the raw material is preferably performed under a non-oxidizing atmosphere (for example, under an inert gas atmosphere such as Ar).

[3.2. Melting/Casting Step]

Next, the raw materials blended are melted and cast to obtain ingots (melting/casting step).

In order to prevent oxidation of raw materials, melting and casting are preferably performed under a non-oxidizing atmosphere (for example, in a vacuum, under an inert gas atmosphere such as Ar, etc.).

The melting temperature is acceptable as long as it allows homogeneous molten metal to be obtained. The optimum melting temperature is, though depending on the raw material composition, normally 1100° C. to 1200° C.

The casting method is not particularly limited, and various methods can be used.

It should be noted that an ingot containing multiple elements is generally prone to segregation. Accordingly, in the state of an ingot, or after the ingot is crushed, the ingot or coarse powder may be subjected to an annealing process.

The annealing condition is acceptable as long as it allows homogenization of components. The annealing temperature is, though depending on the raw material composition, normally 500° C. to 800° C. The annealing time is, though depending on the compositions of the raw materials and annealing temperature, normally 72 hours to 168 hours.

[3.3. Pulverization Step]

Next, the ingot obtained or powder produced by crushing the ingot (including ingots or coarse powders after the annealing process) is pulverized to obtain powder (pulverization step).

The pulverization is preferably performed under an inert atmosphere (for example, in a glove box) to prevent oxidation of raw materials.

The pulverization method is not particularly limited, and an optimum method can be selected depending on the purpose.

[3.4. Sintering Step]

Next, the powder obtained is sintered (sintering step).

The sintering method and sintering conditions are not particularly limited, and optimum methods and conditions can be selected depending on the compositions of the raw material.

In general, the higher the sintering temperature, the shorter the sintering time to obtain the dense sintered body. However, when the sintering temperature becomes too high, crystal grains are likely to be coarsened. An optimum sintering temperature is, though depending on the compositions of the raw materials and sintering method, normally about 500 to 800° C.

The sintering time is selected to be an optimum time depending on the sintering temperature and sintering method. In general, the higher the sintering temperature, the shorter the sintering time to obtain the dense sintered body.

[4. Effect]

In general, the conversion efficiency of the thermoelectric material has a one-to-one correlation with the dimensionless figure of merit ZT, and the higher the ZT, the higher the conversion efficiency. ZT is represented by the following formula:

$$ZT=[(\sigma \times S^2)/\kappa] \times T = [PF/\kappa] \times T$$

($\sigma$: Electric conductivity, S: Seebeck coefficient, $\kappa$: thermal conductivity, T: absolute temperature)

It can be known from this formula that, in order to improve ZT, $\sigma$ and S (or PF) can be improved, or $\kappa$ can be reduced.

In a $Co_4Sb_{12}$-based material, when various filling elements R are doped into vacancy sites, the concentration of the carrier increases. As a result, the electric conductivity $\sigma$ increases. Simultaneously, the lattice vibration is resonantly scattered by the filling element R, so that the thermal conductivity $\kappa$ is reduced. Normally, the filling element R has low solid solubility, and it precipitates when it is doped at a high concentration, whereby a sufficient improvement in performance cannot be realized.

In contrast, when multiple kinds of the filling elements R are doped in combination, precipitation of the filling elements R is suppressed, and an improvement in ZT is allowed. Moreover, the filling elements R vibrate within vacancy sites, and have natural frequency depending on the ionic size and weight of the filling elements, etc. Accordingly, lattice vibration (phonon) in a broader frequency band can be scattered by introducing multiple kinds of the filling elements R, and the thermal conductivity $\kappa$ can be effectively reduced.

Because of the above effects, the thermoelectric property is improved by combining different elements such as alkaline earth metal elements, rare earth elements, and group IIIB elements, etc., and introducing the filling elements R within a certain limited composition range.

Moreover, the degree of reduction in the thermal conductivity $\kappa$ varies depending on the kind of the filling elements R. For example, the thermal conductivity $\kappa$ can be further reduced by introducing a filling element R with a small ionic radius. In addition, the influence on the power factor PF varies depending on the kind of elements because of the valence, ease of solid solution, and other factors of the filling element R.

Accordingly, by combining elements which are effective in reducing the thermal conductivity $\kappa$ and elements which are effective in improving the power factor PF appropriately, the ZT value can be effectively improved.

In addition, the filling elements R are electron dopants, and therefore if their dissolved amounts are increased, the concentration of the carrier is increased. However, by substituting Co sites with Fe as the hole dopant, the concentration of the carrier is optimized. As a result, the carrier component of thermal conductivity is reduced adequately, whereby ZT is further improved.

For example, it is known that in a $Co_4Sb_{12}$-based material, ZT can be greatly improved by increasing the number of filling elements to three. However, with reference to Non-patent Literature 6, the composition reportedly having the performance of ZT=about 1.5 has been examined, but the ZT value could not be increased to 1 or higher in the composition with the amount x of the filling element of about 0.2.

In contrast, in our examination, the lattice thermal conductivity $\kappa_{ph}$ becomes lower with increase in the amount x of the filling element. However, when the amount x of the filling elements increases, the concentration of the carrier also increases, and the carrier component of thermal conductivity $\kappa_{el}$ became higher. In this case, by optimizing the concentration of the carrier by Fe substitution, ZT can be increased even higher.

Patent Literature 4 discloses a high ZT value in a system having the amount x of the filling element 0.6 or higher and containing five kinds of elements (Ca, Yb, Al, Ga, In). However, there is no data of a case where more than five elements are used.

In contrast, as a result of our examination, we found that the ZT value could be improved by increasing the number of filling elements to more than five, and further optimizing the combination of the filling elements R. Moreover, we found that there were combinations of five elements (for example, the combination of Ba, Yb, Al, Ga and In) which can realize the performance higher than that described in literature.

EXAMPLES

1. Experiment (1)

1.1. Preparation of Samples

First, in a glove box purged with an inert gas such as Ar to prevent oxidation of raw materials, raw materials were weighed so that the composition became $(A_aB_bC_c)$ $Co_{4-y}Fe_ySb_{12}$ (x=a+b+c, t=0). Alkaline earth metal elements, rare earth elements, group IIIB elements, Co, Fe and Sb were used as the raw materials. It should be noted that transition metal elements D (Zr, Cu, Ti) other than Fe and rare earth elements were further added to part of the samples.

The raw materials were placed in a quartz tube, and the tube was evacuated by a vacuum pump to $10^{-3}$ Pa or lower. In this state, the opening of the quartz tube was melted to seal the tube. In addition, the quartz tube was heated to 1100° C. to melt the raw materials, and was cooled to obtain an ingot. At this time, in order to suppress the reaction between the raw materials and the quartz tube, a carbon foil or a tungsten foil was placed between the quartz tube and the raw materials.

The ingot prepared was pulverized and mixed in a glove box using a mortar. This was sealed in a quartz tube again. In order to improve the homogeneity of the composition by a solid phase diffusion reaction, it was heated at 700° C. for 100 hours or more.

The prepared sample was manually pulverized in an inert atmosphere. This was heated with a spark plasma sintering (SPS) apparatus at 50 MPa, 500 to 800° C. for 10 minutes, giving a sintered body.

1.2. Test Method

The sintered body was processed into pieces each sizing 10×3×3 mm. Using these rod-shaped samples, the electric conductivities σ and Seebeck coefficients S were evaluated in a temperature range from 100 to 600° C. A thermoelectric property evaluation apparatus (ULVAC, Inc. ZEM3) was used for the measurement.

The sintered body was processed into pieces each sizing 12.5 mm in diameter×1 mm in thickness. Using these disk-shaped sintered bodies, the thermal conductivity κ was evaluated in a temperature range from room temperature to 600° C. by the laser flash method.

In addition, the lattice thermal conductivity $κ_{ph}$ was estimated by the Wiedemann-Franz law from the values of the measured electric conductivities σ and the thermal conductivities κ.

1.3. Results

The thermoelectric properties of the composition of the present invention: $(A_aB_bC_cD_t)$ $Co_{4-y}Fe_ySb_{12}$ (x=a+b+c+t) varied intricately depending on the kinds (kinds of A, B, C and D), and the amounts and ratios (values of a, b, c, t and x) of the filling elements R. Tables 1 to 6 show the list of the compositions carried out in the present invention, and the thermal conductivities κ at room temperature and dimensionless figure of merit ZT at 823K corresponding to these. In the tables, for example, "1.1" means that the sample belongs to composition (1.1) described above. Nos. 49, 124 and 157 are missing numbers. Below, specific compositions (compositions in which t=0, unless otherwise specified) are picked up from these compositions to describe the details of the present invention.

TABLE 1

| Sample No. | x | y | Number of filling elements | Alkaline earth metal A(a) | Rare earth element B(b) | Group IIIB C(c) | Transition metal D(t) | κ | ZT | Composition (1) | Composition (2) |
|---|---|---|---|---|---|---|---|---|---|---|---|
| 1 | 0.2 | 0 | 3 | 0.1Ba | 0.05La0.05Yb | — | — | 3.68 | 0.90 | — | — |
| 2 | 0.3 | 0 | 3 | 0.1Ba | 0.1Yb | 0.1In | — | 3.42 | 1.03 | — | — |
| 3 | 0.3 | 0 | 4 | 0.1Ba | 0.1Yb | 0.05Ga0.05In | — | 3.54 | 0.90 | — | — |
| 4 | 0.3 | 0 | 4 | 0.1Ba | 0.05La0.05Yb | 0.1In | — | 3.61 | 0.96 | — | — |
| 5 | 0.3 | 0.05 | 4 | 0.1Ba | 0.05La0.05Yb | 0.1In | — | 3.20 | 1.01 | — | — |
| 6 | 0.3 | 0.15 | 4 | 0.1Ba | 0.05La0.05Yb | 0.1In | — | 3.22 | 0.83 | — | — |
| 7 | 0.3 | 0.2 | 4 | 0.1Ba | 0.05La0.05Yb | 0.1In | — | 2.85 | 1.04 | — | — |
| 8 | 0.3 | 0.25 | 4 | 0.1Ba | 0.05La0.05Yb | 0.1In | — | 3.01 | 0.64 | — | — |
| 9 | 0.4 | 0 | 1 | — | — | 0.4Al | — | 9.55 | 0.01 | — | — |
| 10 | 0.4 | 0 | 1 | — | — | 0.4Ga | — | 3.62 | 0.33 | — | — |
| 11 | 0.4 | 0 | 1 | — | — | 0.4In | — | 3.577 | 0.96 | — | — |
| 12 | 0.4 | 0 | 2 | — | — | 0.1Al0.3In | — | 3.61 | 0.76 | — | — |
| 13 | 0.4 | 0 | 2 | — | — | 0.2In0.2Al | — | 4.11 | 0.45 | — | — |
| 14 | 0.4 | 0 | 2 | — | — | 0.2Al0.2Ga | — | 4.56 | 0.11 | — | — |
| 15 | 0.4 | 0 | 2 | — | — | 0.2Ga0.2In | — | 3.041 | 0.86 | — | — |
| 16 | 0.4 | 0 | 3 | — | — | 0.1Al0.15Ga0.15In | — | 3.23 | 0.65 | — | — |
| 17 | 0.4 | 0 | 3 | 0.1Ba | 0.2Yb | 0.1In | — | 3.43 | 0.74 | — | — |
| 18 | 0.4 | 0 | 4 | 0.1Ba | 0.05Eu0.15Yb | 0.1In | — | 3.41 | 1.15 | — | — |
| 19 | 0.4 | 0 | 5 | 0.1Ba | 0.05La0.05Eu0.1Yb | 0.1In | — | 3.35 | 1.14 | 1.1, 1.2, 1.4, 1.6, 1.9 | — |
| 20 | 0.4 | 0 | 5 | 0.1Ba | 0.05La0.05Yb | 0.1Al0.1In | — | 3.22 | 1.14 | 1.1, 1.6, 1.9 | — |
| 21 | 0.4 | 0 | 5 | 0.1Ba | 0.05La0.05Yb | 0.1In | 0.1Zn | 3.46 | 1.06 | 1.1, 1.6, 1.9 | — |
| 22 | 0.4 | 0 | 5 | 0.1Ba | 0.05La0.05Yb | 0.1Ga0.1In | — | 3.02 | 1.13 | 1.1, 1.6, 1.9, 1.10 | — |
| 23 | 0.4 | 0 | 5 | 0.1Ba | 0.1Y0.05La0.05Yb | 0.1In | — | 3.45 | 1.05 | 1.1, 1.4, 1.6, 1.9 | — |
| 24 | 0.4 | 0 | 5 | 0.1Ba | 0.05La0.05Yb | 0.1In | 0.1Cu | 3.90 | 0.83 | — | — |
| 25 | 0.35 | 0 | 5 | 0.1Ba | 0.5Sc0.05La0.05Yb | 0.1In | — | 3.42 | 1.08 | — | — |
| 26 | 0.4 | 0 | 5 | 0.1Ba | 0.05La0.1Sm0.05Yb | 0.1In | — | 3.49 | 1.03 | 1.1, 1.4, 1.6, 1.9 | — |
| 27 | 0.4 | 0 | 5 | 0.1Ba | 0.05La0.1Eu0.05Yb | 0.1In | — | 3.54 | 1.00 | 1.1, 1.4, 1.6, 1.9 | — |
| 28 | 0.4 | 0 | 5 | 0.1Ba | 0.05La0.1Gd0.05Yb | 0.1In | — | 3.42 | 1.11 | 1.1, 1.4, 1.6, 1.9 | — |
| 29 | 0.4 | 0 | 5 | 0.1Ba | 0.05La0.1Ho0.05Yb | 0.1In | — | 3.47 | 1.05 | 1.1, 1.4, 1.6, 1.9 | — |
| 30 | 0.4 | 0 | 5 | 0.1Ba | 0.05La0.1Er0.05Yb | 0.1In | — | 3.39 | 1.12 | 1.1, 1.4, 1.6, 1.9 | — |
| 31 | 0.4 | 0 | 5 | 0.1Ba | 0.05La0.1Tm0.05Yb | 0.1In | — | 3.44 | 1.09 | 1.1, 1.4, 1.6, 1.9 | — |
| 32 | 0.4 | 0.1 | 4 | 0.1Ba | 0.05Eu0.15Yb | 0.1In | — | 3.07 | 1.18 | — | — |
| 33 | 0.4 | 0 | 5 | 0.1Ba | 0.05Eu0.15Yb | 0.05Ga0.05In | — | 3.51 | 1.12 | 1.1, 1.2, 1.4, 1.6, 1.9 | — |
| 34 | 0.4 | 0 | 6 | 0.1Ba | 0.05La0.05Eu0.1Yb | 0.05Ga0.05In | — | 3.49 | 1.19 | 1.1, 1.2, 1.4], 1.6, 1.9 | — |
| 35 | 0.4 | 0 | 1 | — | 0.4Yb | — | — | 3.515 | 1.09 | — | — |

TABLE 2

| Sample No. | x | y | Number of filling elements | Alkaline earth metal A(a) | Rare earth element B(b) | Group IIIB C(c) |
|---|---|---|---|---|---|---|
| 36 | 0.4 | 0 | 2 | — | 0.2Eu0.2Yb | — |
| 37 | 0.4 | 0 | 2 | — | 0.2La0.2Yb | — |
| 38 | 0.4 | 0 | 3 | — | 0.1La0.1Eu0.2Yb | — |
| 39 | 0.4 | 0 | 1 | 0.4Ba | — | — |
| 40 | 0.4 | 0 | 2 | 0.1Ca0.3Ba | — | — |
| 41 | 0.4 | 0 | 3 | 0.1Ca0.1Sr0.2Ba | — | — |
| 42 | 0.45 | 0 | 4 | 0.1Ba | 0.05La0.2Yb | 0.1In |
| 43 | 0.5 | 0 | 5 | 0.1Ba | 0.05Eu0.15Yb | 0.1Ga0.1In |
| 44 | 0.5 | 0.05 | 5 | 0.1Ba | 0.1Eu0.1Yb | 0.1Ga0.1In |
| 45 | 0.5 | 0 | 4 | 0.1Ba | 0.1La0.2Yb | 0.1In |
| 46 | 0.5 | 0 | 4 | 0.2Ba | 0.1La0.1Yb | 0.1In |
| 47 | 0.5 | 0.05 | 1 | — | — | 0.5In |
| 48 | 0.5 | 0.05 | 3 | — | — | 0.1Al0.15Ga0.25In |
| 50 | 0.5 | 0.1 | 5 | 0.1Ba | 0.05Eu0.15Yb | 0.1Ga0.1In |
| 51 | 0.5 | 0.2 | 5 | 0.1Ba | 0.05Eu0.15Yb | 0.1Ga0.1In |
| 52 | 0.5 | 0.1 | 6 | 0.1Ba | 0.05Eu0.15Yb | 0.07Al0.06Ga0.07In |
| 53 | 0.5 | 0.05 | 1 | — | 0.5Yb | — |
| 54 | 0.5 | 0.05 | 2 | — | 0.25Eu0.25Yb | — |
| 55 | 0.5 | 0.05 | 2 | — | 0.25La0.25Yb | — |
| 56 | 0.5 | 0.05 | 3 | — | 0.15La0.15Eu0.2Yb | — |
| 57 | 0.5 | 0.05 | 4 | — | 0.1La0.05Pr0.15Eu0.2Yb | — |
| 58 | 0.5 | 0.05 | 5 | — | 0.05La0.05Pr0.15Eu0.05Ho0.2Yb | — |
| 59 | 0.5 | 0.05 | 4 | 0.2Ba | 0.1La0.1Yb | 0.1In |
| 60 | 0.5 | 0.05 | 1 | 0.5Ba | — | — |
| 61 | 0.5 | 0.05 | 2 | 0.15Ca0.35Ba | — | — |
| 62 | 0.5 | 0.05 | 3 | 0.05Ca0.15Sr0.3Ba | — | — |
| 63 | 0.5 | 0.1 | 4 | 0.2Ba | 0.1La0.1Yb | 0.1In |
| 64 | 0.5 | 0.15 | 4 | 0.2Ba | 0.1La0.1Yb | 0.1In |
| 65 | 0.6 | 0 | 5 | 0.1Ba | 0.05La0.05Eu0.2Yb | 0.2In |
| 66 | 0.6 | 0 | 6 | 0.1Ba | 0.05La0.05Eu0.2Yb | 0.1Ga0.1In |
| 67 | 0.6 | 0.1 | 1 | — | 0.6Yb | — |
| 68 | 0.6 | 0.1 | 2 | — | 0.3Eu0.3Yb | — |
| 69 | 0.6 | 0.1 | 3 | — | 0.2La0.2Eu0.2Yb | — |
| 70 | 0.6 | 0.1 | 4 | — | 0.1La0.1Pr0.2Eu0.2Yb | — |

| Sample No. | Transition metal D(t) | κ | ZT | Composition (1) | Composition (2) |
|---|---|---|---|---|---|
| 36 | — | 3.728 | 1.14 | — | — |
| 37 | — | 3.131 | 0.93 | — | — |
| 38 | — | 3.43 | 1.07 | — | — |
| 39 | — | 5.21 | 0.74 | — | — |
| 40 | — | 4.964 | 0.78 | — | — |
| 41 | — | 5.05 | 0.87 | — | — |
| 42 | — | 3.10 | 1.14 | — | — |
| 43 | — | 3.23 | 1.29 | 1.1, 1.2, 1.4, 1.6, 1.9, 1.10 | — |
| 44 | — | 2.96 | 1.25 | 1.1, 1.2, 1.4, 1.6, 1.9, 1.10 | — |
| 45 | — | 3.07 | 1.07 | — | — |
| 46 | — | 3.61 | 1.14 | — | — |
| 47 | — | 3.312 | 0.96 | — | — |
| 48 | — | 3.5 | 0.57 | — | — |
| 50 | — | 2.85 | 1.26 | 1.1, 1.2, 1.4, 1.6, 1.9, 1.10 | — |
| 51 | — | 2.54 | 1.12 | 1.1, 1.2, 1.4, 1.6, 1.9, 1.10 | — |
| 52 | — | 2.92 | 1.25 | 1.1, 1.2, 1.4, 1.6, 1.9, 1.10 | — |
| 53 | — | 3.42 | 1.19 | — | — |
| 54 | — | 3.76 | 1.08 | — | — |
| 55 | — | 3.11 | 0.84 | — | — |
| 56 | — | 3.51 | 0.98 | — | — |
| 57 | — | 3.51 | 0.99 | — | — |
| 58 | — | 3.16 | 1.02 | — | — |
| 59 | — | 3.31 | 1.00 | — | — |
| 60 | — | 4.88 | 0.78 | — | — |
| 61 | — | 4.88 | 0.68 | — | — |
| 62 | — | 4.82 | 0.82 | — | — |
| 63 | — | 3.10 | 0.92 | — | — |
| 64 | — | 3.20 | 0.90 | — | — |
| 65 | — | 3.25 | 1.22 | 1.1, 1.2, 1.4, 1.6, 1.9 | — |
| 66 | — | 3.39 | 1.17 | 1.1, 1.2, 1.4, 1.6, 1.9, 1.10 | 2.3 |
| 67 | — | 3.56 | 0.95 | — | — |
| 68 | — | 3.67 | 0.79 | — | — |
| 69 | — | 3.24 | 0.79 | — | — |
| 70 | — | 3.36 | 0.83 | — | — |

TABLE 3

| Sample No. | x | y | Number of filling elements | Alkaline earth metal A(a) | Rare earth element B(b) | Group IIIB C(c) | Transition metal D(t) | κ | ZT | Composition (1) | Composition (2) |
|---|---|---|---|---|---|---|---|---|---|---|---|
| 71 | 0.6 | 0.1 | 5 | — | 0.1La0.05Pr0.2Eu0.05Ho0.2Yb | — | — | 3.29 | 1.05 | — | — |
| 72 | 0.6 | 0.1 | 6 | — | 0.1La0.05Pr0.15Eu0.05Ho0.05Er0.2Yb | — | — | 3.27 | 1.00 | — | — |
| 73 | 0.6 | 0 | 5 | 0.1Ba | 0.1Eu0.2Yb | 0.1Ga0.1In | — | 3.24 | 1.29 | 1.1, 1.2, 1.4, 1.6, 1.9, 1.10 | — |
| 74 | 0.6 | 0.05 | 5 | 0.1Ba | 0.1Eu0.2Yb | 0.1Ga0.1In | — | 3.09 | 1.29 | 1.1, 1.2, 1.4, 1.6, 1.9, 1.10 | — |
| 75 | 0.6 | 0.1 | 5 | 0.1Ba | 0.1Eu0.2Yb | 0.1Ga0.1In | — | 2.80 | 1.23 | 1.1, 1.2, 1.4, 1.6, 1.9, 1.10 | — |
| 76 | 0.6 | 0.2 | 5 | 0.1Ba | 0.1Eu0.2Yb | 0.1Ga0.1In | — | 2.78 | 1.29 | 1.1, 1.2, 1.4, 1.6, 1.9, 1.10 | — |
| 77 | 0.6 | 0.2 | 7 | 0.1Ba | 0.05La0.05Eu0.2Yb | 0.07Al0.05Ga0.07In | — | 2.83 | 1.29 | 1.1, 1.2, 1.4, 1.6, 1.9, 1.10 | 2.3 |
| 78 | 0.6 | 0.2 | 6 | 0.1Ba | 0.05Eu0.15Yb | 0.1Al0.1Ga0.1In | — | 2.53 | 1.31 | 1.1, 1.2, 1.4, 1.6, 1.9, 1.10 | — |
| 79 | 0.6 | 0.2 | 6 | 0.1Ba | 0.1Eu0.2Yb | 0.07Al0.06Ga0.07In | — | 2.82 | 1.32 | 1.1, 1.2, 1.4, 1.6, 1.9, 1.10 | — |
| 80 | 0.6 | 0.1 | 1 | 0.6Ba | — | — | — | 5.166 | 0.67 | — | — |
| 81 | 0.6 | 0.1 | 2 | 0.2Ca0.4Ba | — | — | — | 4.81 | 0.82 | — | — |
| 82 | 0.6 | 0.1 | 3 | 0.1Ca0.15Sr0.35Ba | — | — | — | 4.941 | 0.79 | — | — |
| 83 | 0.7 | 0 | 5 | 0.1Ba | 0.05La0.05Eu0.2Yb | 0.3In | — | 3.25 | 1.19 | 1.1, 1.2, 1.4, 1.6, 1.9 | — |
| 84 | 0.7 | 0.1 | 5 | 0.1Ba | 0.1Eu0.2Yb | 0.15Ga0.15In | — | 2.74 | 1.29 | 1.1, 1.2, 1.4, 1.6, 1.9, 1.10 | — |
| 85 | 0.7 | 0 | 6 | 0.1Ba | 0.05La0.05Eu0.2Yb | 0.15Ga0.15In | — | 3.06 | 1.36 | 1.1, 1.2, 1.4, 1.6, 1.9, 1.10 | 2.1, 2.3 |
| 86 | 0.7 | 0.1 | 6 | 0.1Ba | 0.05La0.05Eu0.2Yb | 0.15Ga0.15In | — | 2.80 | 1.37 | 1.1, 1.2, 1.4, 1.6, 1.9, 1.10 | 2.1, 2.3 |
| 87 | 0.7 | 0.2 | 6 | 0.1Ba | 0.05La0.05Eu0.2Yb | 0.15Ga0.15In | — | 2.60 | 1.33 | 1.1, 1.2, 1.4, 1.6, 1.9, 1.10 | 2.1, 2.3 |
| 88 | 0.7 | 0 | 7 | 0.1Ba | 0.05La0.05Eu0.2Yb | 0.05Al0.1Ga0.15In | — | 3.15 | 1.33 | 1.1, 1.2, 1.4, 1.6, 1.9, 1.10 | 2.1, 2.3 |
| 89 | 0.7 | 0.1 | 7 | 0.1Ba | 0.05La0.05Eu0.2Yb | 0.05Al0.1Ga0.15In | — | 2.94 | 1.31 | 1.1, 1.2, 1.4, 1.6, 1.9, 1.10 | 2,1, 2.3 |
| 90 | 0.7 | 0.2 | 7 | 0.1Ba | 0.05La0.05Eu0.2Yb | 0.05Al0.1Ga0.15In | — | 2.67 | 1.40 | 1.1, 1.2, 1.4, 1.6, 1.9, 1.10 | 2.1, 2.3 |
| 91 | 0.7 | 0 | 7 | 0.1Ba | 0.05La0.05Eu0.2Yb | 0.1Al0.1Ga0.1In | — | 3.35 | 1.24 | 1.1, 1.2, 1.4, 1.6, 1.9, 1.10 | 2.1, 2.3 |
| 92 | 0.7 | 0 | 7 | 0.1Ba | 0.05La0.05Gd0.2Yb | 0.1Al0.1Ga0.1In | — | 2.87 | 1.13 | 1.1, 1.2, 1.4, 1.6, 1.9, 1.10 | 2.1 |
| 93 | 0.7 | 0.15 | 4 | 0.1Ba | 0.1Gd0.2Yb | 0.3Al | — | 3.02 | 1.12 | — | — |
| 94 | 0.7 | 0.2 | 4 | 0.1Ba | 0.1Gd0.2Yb | 0.3Al | — | 2.82 | 1.06 | — | — |
| 95 | 0.7 | 0.25 | 2 | — | 0.35Yb | 0.35In | — | 2.59 | 1.18 | — | — |
| 96 | 0.7 | 0.25 | 2 | 0.35Ba | 0.35Yb | — | — | 3.68 | 1.04 | — | — |
| 97 | 0.7 | 0.25 | 2 | 0.35Ba | — | 0.35In | — | 3.01 | 1.10 | — | — |
| 98 | 0.7 | 0.25 | 3 | — | — | 0.15Al0.2Ga035In | — | .2.23 | 0.31 | — | — |
| 99 | 0.7 | 0.25 | 4 | — | 0.1Yb | 0.1Al0.2Ga0.3In | — | 2.26 | 0.77 | — | — |
| 100 | 0.7 | 0.25 | 4 | — | 0.2Yb | 0.1Al0.15Ga0.25In | — | 2.36 | 1.06 | — | — |
| 101 | 0.7 | 0.25 | 5 | — | 0.1Eu0.2Yb | 0.1Al0.1Ga0.2In | — | 2.49 | 1.28 | 1.1, 1.2, 1.4, 1.9, 1.10 | — |
| 102 | 0.7 | 0.25 | 7 | — | 0.05La0.05Pr0.1Eu0.2Yb | 0.1Al0.1Ga0.1In | — | 2.52 | 1.25 | 1.1, 1.2, 1.5, 1.9, 1.10 | — |
| 103 | 0.7 | 0.25 | 8 | — | 0.05La0.05Pr0.15Eu0.05Ho0.2Yb | 0.07Al0.06Ga0.07In | — | 2.70 | 1.26 | 1.1, 1.2, 1.5, 1.9, 1.10 | — |
| 104 | 0.7 | 0.25 | 8 | — | 0.1La0.05Pr0.2Eu0.05Ho0.2Yb | 0.025Al0.025Ga0.05In | — | | | | |
| 105 | 0.7 | 0.25 | 1 | — | 0.7Yb | — | — | | | | |

TABLE 3-continued

| | | | | | |
|---|---|---|---|---|---|
| 104 | — | 2.88 | 1.21 | 1.1, 1.2, 1.5, 1.9 | — |
| 105 | — | 3.089 | 1.04 | — | — |

TABLE 4

| Sample No. | x | y | Number of filling elements | Alkaline earth metal A(a) | Rare earth element B(b) | Group IIIB C(c) |
|---|---|---|---|---|---|---|
| 106 | 0.7 | 0.25 | 2 | — | 0.3Eu0.4Yb | — |
| 107 | 0.7 | 0.25 | 3 | — | 0.2La0.3Eu0.2Yb | — |
| 108 | 0.7 | 0.25 | 5 | — | 0.1La0.05Pr0.3Eu0.05Ho0.2Yb | — |
| 109 | 0.7 | 0.25 | 6 | — | 0.05La0.05Pr0.3Eu0.05Ho0.05Er0.2Yb | — |
| 110 | 0.7 | 0.25 | 4 | 0.05Ba | 0.05Gd0.3Yb | 0.3Al |
| 111 | 0.7 | 0.25 | 5 | 0.1Ba | 0.1Yb | 0.1Al0.15Ga0.2In |
| 112 | 0.7 | 0.25 | 5 | 0.1Ba | 0.2Yb | 0.1Al0.1Ga0.2In |
| 113 | 0.7 | 0.25 | 6 | 0.1Ba | 0.2Yb | 0.1Al0.1Ga0.1In |
| 114 | 0.7 | 0.25 | 7 | 0.1Ba | 0.05Eu0.2Yb | 0.1Al0.1Ga0.In |
| 115 | 0.7 | 0.25 | 4 | 0.1Ba | 0.1Gd0.2Yb | 0.3Al |
| 116 | 0.7 | 0.25 | 5 | 0.1Ba | 0.1La0.2Yb | 0.15Ga0.15In |
| 117 | 0.7 | 0.25 | 5 | 0.1Ba | 0.3Yb | 0.1Al0.1Ga0.In |
| 118 | 0.7 | 0.25 | 6 | 0.1Ba | 0.1Eu0.2Yb | 0.1Al0.1Ga0.1In |
| 119 | 0.7 | 0.25 | 5 | 0.1Ba | 0.05La0.05Eu0.2Yb | 0.3In |
| 120 | 0.7 | 0.25 | 5 | 0.1Ba | 0.05La0.05Eu0.2Yb | 0.3Al |
| 121 | 0.7 | 0.25 | 5 | 0.1Ba | 0.05La0.05Eu0.2Yb | 0.3Ga |
| 122 | 0.7 | 0.25 | 6 | 0.1Ba | 0.05La0.05Eu0.2Yb | 0.15Al0.15In |
| 123 | 0.7 | 0.26 | 6 | 0.1Ba | 0.05La0.05Eu0.2Yb | 0.15Ga0.15In |
| 125 | 0.7 | 0.25 | 5 | 0.1Ba | 0.3Eu | 0.1Al0.1Ga0.1In |
| 126 | 0.7 | 0.25 | 5 | 0.1Ba | 0.3Yb | 0.1Al0.1Ga0.1In |
| 127 | 0.7 | 0.25 | 6 | 0.1Ba | 0.1La0.2Yb | 0.1Al0.1Ga0.1In |
| 128 | 0.7 | 0.1 | 7 | 0.1Ba | 0.05La0.05Eu0.2Yb | 0.1Al0.1Ga0.1In |
| 129 | 0.7 | 0.15 | 7 | 0.1Ba | 0.05La0.05Eu0.2Yb | 0.1Al0.1Ga0.1In |
| 130 | 0.7 | 0.2 | 7 | 0.1Ba | 0.05La0.05Eu0.2Yb | 0.1Al0.1Ga0.1In |
| 131 | 0.7 | 0.25 | 7 | 0.1Ba | 0.05La0.05Eu0.2Yb | 0.1Al0.1Ga0.1In |
| 132 | 0.7 | 0.3 | 7 | 0.1Ba | 0.05La0.05Eu0.2Yb | 0.1Al0.1Ga0.1In |
| 133 | 0.7 | 0.25 | 5 | 0.1Ba | 0.05La0.05Gd0.2Yb | 0.3Al |
| 134 | 0.7 | 0.25 | 5 | 0.1Ba | 0.05La0.05Gd0.2Yb | 0.3Ga |
| 135 | 0.7 | 0.25 | 5 | 0.1Ba | 0.05La0.05Gd0.2Yb | 0.3In |
| 136 | 0.7 | 0.25 | 6 | 0.1Ba | 0.05La0.05Gd0.2Yb | 0.1Al0.2In |
| 137 | 0.7 | 0 | 7 | 0.1Ba | 0.05La0.05Gd0.2Yb | 0.1Al0.1Ga0.1In |
| 138 | 0.7 | 0.1 | 7 | 0.1Ba | 0.05La0.05Gd0.2Yb | 0.1Al0.1Ga0.1In |
| 139 | 0.7 | 0.2 | 7 | 0.1Ba | 0.05La0.05Gd0.2Yb | 0.1Al0.1Ga0.1In |
| 140 | 0.7 | 0.25 | 7 | 0.1Ba | 0.05La0.05Gd0.2Yb | 0.1Al0.1Ga0.1In |

| Sample No. | Transition metal D(t) | κ | ZT | Composition (1) | Composition (2) |
|---|---|---|---|---|---|
| 106 | — | 3.246 | 1.05 | — | — |
| 107 | — | 3.198 | 0.80 | — | — |
| 108 | — | 3.518 | 1.08 | — | — |
| 109 | — | 3.23 | 1.06 | — | — |
| 110 | — | 2.75 | 1.09 | — | — |
| 111 | — | 2.395 | 1.06 | 1.1, 1.2, 1.6 | — |
| 112 | — | 2.45 | 1.26 | 1.1, 1.2, 1.6, 1.9 | — |
| 113 | 0.1Ti | 2.58 | 1.24 | 1.1, 1.2, 1.6, 1.9, 1.10 | 2.1 |
| 114 | 0.05Ti | 2.60 | 1.34 | 1.1, 1.2, 1.4, 1.6, 1.9, 1.10 | 2.1 |
| 115 | — | 2.55 | 1.12 | — | — |
| 116 | — | 2.52 | 1.28 | 1,1, 1.2, 1.4, 1.6, 1.9, 1.10 | — |
| 117 | — | 2.56 | 1.31 | 1.1, 1.2, 1.6, 1.9, 1.10 | — |
| 118 | — | 2.62 | 1.34 | 1.1, 1.2, 1.4, 1.6, 1.9, 1.10 | 2.1 |
| 119 | — | 2.806 | 1.34 | 1.1, 1.2, 1.4, 1.6, 1.9 | — |
| 120 | — | 2.886 | 1.15 | — | — |
| 121 | — | 2.637 | 1.15 | — | — |
| 122 | — | 2.797 | 1.25 | 1.1, 1.2, 1.4, 1.6, 1.9 | 2.1 |
| 123 | — | 2.568 | 1.27 | 1.1, 1.2, 1.4, 1.6, 1.9, 1.10 | 2.1, 2.3 |
| 125 | — | 3.09 | 1.16 | 1.1, 1.6, 1.9, 1.10 | — |
| 126 | — | 2.66 | 1.38 | 1.1, 1.2, 1.6, 1.9, 1.10 | — |
| 127 | — | 2.49 | 1.38 | 1.1, 1.2, 1.4, 1.6, 1.9, 1.10 | 2.1 |
| 128 | — | 2.95 | 1.27 | 1.1, 1.2, 1.4, 1.6, 1.9, 1.10 | 2.1, 2.3 |
| 129 | — | 2.85 | 1.28 | 1.1, 1.2, 1.4, 1.6, 1.9, 1.10 | 2.1, 2.3 |
| 130 | — | 2.78 | 1.28 | 1.1, 1.2, 1.4, 1.6, 1.9, 1.10 | 2.1, 2.3 |
| 131 | — | 2.43 | 1.46 | 1.1, 1.2, 1.4, 1.6, 1.9, 1.10 | 2.1, 2.3 |
| 132 | — | 2.41 | 1.40 | 1.1, 1.2, 1.4, 1.6, 1.9, 1.10 | 2.1, 2.3 |
| 133 | — | 2.77 | 1.05 | — | — |
| 134 | — | 2.32 | 1.16 | — | — |

TABLE 4-continued

| | | | | | |
|---|---|---|---|---|---|
| 135 | — | 2.67 | 1.24 | 11, 1.2, 1.4, 1.6, 1.9 | — |
| 136 | — | 2.56 | 1.23 | 1.1, 1.2, 1.4, 1.6, 1.9 | 2.1 |
| 137 | — | 3.25 | 1.27 | 1.1, 1.2, 1.4, 1.6, 1.9, 1.10 | 2.1 |
| 138 | — | 2.70 | 1.34 | 1.1, 1.2, 1.4, 1.6, 1.9, 1.10 | 2.1 |
| 139 | — | 2.57 | 1.39 | 1.1, 1.2, 1.4, 1.6, 1.9, 1.10 | 2.1 |
| 140 | — | 2.52 | 1.29 | 1.1, 1.2, 1.4, 1.6, 1.9, 1.10 | 2.1 |

TABLE 5

| Sample No. | x | y | Number of filling elements | Alkaline earth metal A(a) | Rare earth element B(b) | Group IIIB C(c) |
|---|---|---|---|---|---|---|
| 141 | 0.7 | 0.3 | 7 | 0.1Ba | 0.05La0.05Gd0.2Yb | 0.1Al0.1Ga0.1In |
| 142 | 0.7 | 0.25 | 8 | 0.1Ba | 0.05La0.05Eu0.05Ho0.15Yb | 0.1Al0.1Ga0.1In |
| 143 | 0.7 | 0.25 | 9 | 0.1Ba | 0.05La0.05Pr0.05Eu0.05Ho0.1Yb | 0.1Al0.1Ga0.1In |
| 144 | 0.7 | 0.25 | 9 | 0.1Ba | 0.025La0.025Pr0.025Gd0.025Eu0.2Yb | 0.1Al0.1Ga0.1In |
| 145 | 0.7 | 0.25 | 9 | 0.1Ba | 0.025La0.025Pr0.025Gd0.05Eu0.2Yb | 0.1Al0.075Ga0.1In |
| 146 | 0.7 | 0.25 | 10 | 0.1Ba | 0.025La0.0125Ce0.0125Pr0.025Gd0.025Eu0.2Yb | 0.1Al0.1Ga0.1In |
| 147 | 0.7 | 0.25 | 8 | 0.1Ba | 0.05La0.05Pr0.1Eu0.2Yb | 0.07Al0.06Ga0.07In |
| 148 | 0.7 | 0.25 | 9 | 0.1Ba | 0.05La0.05Pr0.15Eu0.05Ho0.2Yb | 0.025Al0.025Ga0.05In |
| 149 | 0.7 | 0.25 | 6 | 0.1Ba | 0.1La0.05Pr0.2Eu0.05Ho0.2Yb | — |
| 150 | 0.7 | 0.25 | 6 | 0.05Ca0.05Sr0.1Ba | — | 0.1Al0.15Ga0.25In |
| 151 | 0.7 | 0.25 | 7 | 0.05Ca0.05Sr0.1Ba | 0.1Yb | 0.1Al0.1Ga0.2In |
| 152 | 0.7 | 0.25 | 4 | 0.2Ba | 0.1Gd0.1Yb | 0.3Al |
| 153 | 0.7 | 0.25 | 7 | 0.05Ca0.05Sr0.1Ba | 0.2Yb | 0.1Al0.1Ga0.1In |
| 154 | 0.7 | 0.25 | 5 | 0.2Ba | 0.15Eu0.15Yb | 0.1Al0.1In |
| 155 | 0.7 | 0.27 | 5 | 0.2Ba | 0.15Eu0.15Yb | 0.1Al0.1In |
| 156 | 0.7 | 0.3 | 5 | 0.2Ba | 0.15Eu0.15Yb | 0.1Al0.1In |
| 158 | 0.7 | 0.25 | 6 | 0.2Ba | 0.05La0.05Eu0.2Yb | 0.1Al0.1In |
| 159 | 0.7 | 0.25 | 6 | 0.2Ba | 0.05La0.05Eu0.2Yb | 0.1Ga0.1In |
| 160 | 0.7 | 0.25 | 7 | 0.2Ba | 0.05La0.05Eu0.2Yb | 0.05Al0.05Ga0.1In |
| 161 | 0.7 | 0.25 | 4 | 0.2Ba | 0.1Gd0.2Yb | 0.2Al |
| 162 | 0.7 | 0.25 | 4 | 0.2Ba | 0.2Gd0.1Yb | 0.2Al |
| 163 | 0.7 | 0.25 | 7 | 0.2Ba | 0.05La0.05Eu0.2Yb | 0.07Al0.06Ga0.07In |
| 164 | 0.7 | 0.25 | 9 | 0.05Ca0.05Sr0.1Ba | 0.05La0.05Eu0.2Yb | 0.07Al0.06Ga0.07In |
| 165 | 0.7 | 0.25 | 4 | 0.2Ba | 0.2Gd0.2Yb | 0.1Al |
| 166 | 0.7 | 0.25 | 8 | 0.05Ca0.05Sr0.1Ba | 0.05La0.05Pr0.1Eu0.2Yb | 0.1In |
| 167 | 0.7 | 0.25 | 6 | 0.2Ba | 0.05La0.05Pr0.15Eu0.05Ho0.2Yb | — |
| 168 | 0.7 | 0.25 | 6 | 0.1Ca0.1Sr0.1Ba | — | 0.1Al0.1Ga0.2In |
| 169 | 0.7 | 0.25 | 7 | 0.1Ca0.1Sr0.1Ba | 0.1Yb | 0.1Al0.1Ga0.1In |
| 170 | 0.7 | 0.25 | 4 | 0.3Ba | 0.1Gd0.1Yb | 0.2Al |
| 171 | 0.7 | 0.25 | 7 | 0.1Ca0.1Sr0.1Ba | 0.2Yb | 0.07Al0.06Ga0.07In |
| 172 | 0.7 | 0.25 | 4 | 0.3Ba | 0.1Gd0.2Yb | 0.1Al |
| 173 | 0.7 | 0.25 | 7 | 0.1Ca0.1Sr0.1Ba | 0.05La0.05Eu0.2Yb | 0.1In |
| 174 | 0.7 | 0.25 | 4 | 0.3Ba | 0.05Gd0.3Yb | 0.05Al |
| 175 | 0.7 | 0.25 | 7 | 0.1Ca0.1Sr0.1Ba | 0.05La0.05Pr0.1Eu0.2Yb | — |

| Sample No. | Transition metal D(t) | κ | ZT | Composition (1) | Composition (2) |
|---|---|---|---|---|---|
| 141 | — | 2.45 | 1.30 | 1.1, 1.2, 1.4, 1.6, 1.9, 1.10 | 2.1 |
| 142 | — | 2.66 | 1.28 | 1.1, 1.2, 1.4, 1.6, 1.9, 1.10 | 2.1, 2.3 |
| 143 | — | 2.57 | 1.29 | 1.1, 1.2, 1.4, 1.6, 1.9, 1.10 | 2.1, 2.3 |
| 144 | — | 2.59 | 1.28 | 1.1, 1.2, 1.4, 1.6, 1.9, 1.10 | 2.1, 2.3 |
| 145 | — | 2.72 | 1.29 | 1.1, 1.2, 1.5, 1.6, 1.9, 1.10 | 2.1, 2.3 |
| 146 | — | 2.55 | 1.39 | 1.1, 1.2, 1.4, 1.6, 1.9, 1.10 | 2.1, 2.3 |
| 147 | — | 2.63 | 1.30 | 1.1, 1.2, 1.5, 1.6, 1.9, 1.10 | 2.1, 2.3 |
| 148 | — | 3.08 | 1.17 | 1.1, 1.2, 1.5, 1.6, 1.9 | 2.1 |
| 149 | — | 3.64 | 0.95 | — | — |
| 150 | — | 2.44 | 1.01 | 1.1, 1.3, 1.6 | — |
| 151 | — | 2.55 | 1.27 | 1.1, 1.2, 1.6, 1.9, 1.10 | 2.1 |
| 152 | — | 2.76 | 1.15 | — | — |
| 153 | — | 2.63 | 1.36 | 1.1, 1.2, 1.6, 1.9, 1.10 | 2.1 |
| 154 | — | 2.98 | 1.17 | 1.1, 1.2, 1.4, 1.6, 1.9 | — |
| 155 | — | 2.92 | 1.16 | 1.1, 1.2, 1.4, 1.6, 1.9 | — |
| 156 | — | 2.91 | 1.12 | 1.1, 1.2, 1.4, 1.6, 1.9 | — |
| 158 | — | 3.05 | 1.20 | 1.1, 1.2, 1.4, 1.6, 1.9 | 2.1 |
| 159 | — | 2.76 | 1.28 | 1.1, 1.2, 1.4, 1.6, 1.9, 1.10 | 2.1, 2.3 |
| 160 | — | 2.70 | 1.27 | 1.1, 1.2, 1.4, 1.6, 1.9, 1.10 | 2.1, 2.3 |
| 161 | — | 2.97 | 1.07 | — | — |
| 162 | — | 3.02 | 0.93 | — | — |
| 163 | — | 2.959 | 1.20 | 1.1, 1.2, 1.4, 1.6, 1.9, 1.10 | 2.1, 2.3 |
| 164 | — | 2.80 | 1.28 | 1.1, 1.2, 1.4, 1.6, 1.9, 1.10 | 2.1, 2.3 |
| 165 | — | 2.92 | 1.04 | — | — |

TABLE 5-continued

| | | | | | |
|---|---|---|---|---|---|
| 166 | — | 3.06 | 1.20 | 1.1, 1.2, 1.5, 1.6, 1.9 | 2.1 |
| 167 | — | 3.66 | 1.01 | — | — |
| 168 | — | 2.677 | 1.20 | 1.1, 1.3, 1.6, 1.7, 1.9, 1.10 | — |
| 169 | — | 2.706 | 1.23 | 1.1, 1.2, 1.6, 1.7, 1.9, 1.10 | 2.1 |
| 170 | — | 3.03 | 1.18 | — | — |
| 171 | — | 2.69 | 1.30 | 1.1, 1.2, 1.6, 1.7, 1.9, 1.10 | 2.1 |
| 172 | — | 3.30 | 1.05 | — | — |
| 173 | — | 3.03 | 1.21 | 1.1, 1.2, 1.4, 1.6, 1.7, 1.9 | 2.1 |
| 174 | — | 3.37 | 1.01 | — | — |
| 175 | — | 3.533 | 1.15 | — | — |

TABLE 6

| Sample No. | x | y | Number of filling elements | Alkaline earth metal A(a) | Rare earth element B(b) | Group IIIB C(c) |
|---|---|---|---|---|---|---|
| 176 | 0.7 | 0.25 | 6 | 0.1Ca0.1Sr0.2Ba | — | 0.1Al0.1Ga0.1In |
| 177 | 0.7 | 0.25 | 7 | 0.1Ca0.1Sr0.2Ba | 0.1Yb | 0.07Al0.06Ga0.07In |
| 178 | 0.7 | 0.25 | 7 | 0.1Ca0.1Sr0.2Ba | 0.2Yb | 0.025Al0.025Ga0.05In |
| 179 | 0.7 | 0.25 | 6 | 0.1Ca0.1Sr0.2Ba | 0.05La0.05Eu0.2Yb | — |
| 180 | 0.7 | 0.25 | 6 | 0.05Ca0.15Sr0.3Ba | — | 0.07Al0.06Ga0.07In |
| 181 | 0.7 | 0.25 | 7 | 0.05Ca0.15Sr0.3Ba | 0.1Yb | 0.025Al0.025Ga0.05In |
| 182 | 0.7 | 0.25 | 4 | 0.05Ca0.15Sr0.3Ba | 0.2Yb | — |
| 183 | 0.7 | 0.25 | 4 | 0.1Ca0.15Sr0.35Ba | 0.1Yb | — |
| 184 | 0.7 | 0.25 | 6 | 0.1Ca0.15Sr0.35Ba | — | 0.025Al0.025Ga0.05In |
| 185 | 0.7 | 0.25 | 1 | 0.7Ba | — | — |
| 186 | 0.7 | 0.25 | 2 | 0.2Ca0.5Ba | — | — |
| 187 | 0.7 | 0.25 | 3 | 0.15Ca0.2Sr0.35Ba | — | — |
| 188 | 0.7 | 0.3 | 4 | 0.1Ba | 0.1Gd0.2Yb | 0.3Al |
| 189 | 0.75 | 0.25 | 7 | 0.1Ba | 0.05La0.1Eu0.2Yb | 0.1Al0.1Ga0.1In |
| 190 | 0.75 | 0.27 | 7 | 0.1Ba | 0.05La0.1Eu0.2Yb | 0.1Al0.1Ga0.1In |
| 191 | 0.75 | 0.3 | 7 | 0.1Ba | 0.05La0.1Eu0.2Yb | 0.1Al0.1Ga0.1In |
| 192 | 0.75 | 0.35 | 7 | 0.1Ba | 0.05La0.1Eu0.2Yb | 0.1Al0.1Ga0.1In |
| 193 | 0.8 | 0 | 6 | 0.15Ba | 0.1La0.05Eu0.2Yb | 0.15Ga0.15In |
| 194 | 0.8 | 0.1 | 6 | 0.15Ba | 0.1La0.05Eu0.2Yb | 0.15Ga0.15In |
| 195 | 0.8 | 0.2 | 6 | 0.15Ba | 0.1La0.05Eu0.2Yb | 0.15Ga0.15In |
| 196 | 0.8 | 0.3 | 7 | 0.1Ba | 0.1La0.1Eu0.2Yb | 0.1Al0.1Ga0.1In |
| 197 | 0.8 | 0.35 | 7 | 0.1Ba | 0.1La0.1Eu0.2Yb | 0.1Al0.1Ga0.1In |
| 198 | 0.8 | 0.3 | 1 | — | 0.8Yb | — |
| 199 | 0.8 | 0.3 | 2 | — | 0.4Eu0.4Yb | — |
| 200 | 0.8 | 0.3 | 3 | — | 0.15La0.35Eu0.3Yb | — |
| 201 | 0.9 | 0 | 7 | 0.1Sr0.15Ba | 0.05La0.1Eu0.2Yb | 0.15Ga0.15In |
| 202 | 0.9 | 0.1 | 7 | 0.1Sr0.15Ba | 0.05La0.1Eu0.2Yb | 0.15Ga0.15In |
| 203 | 0.9 | 0.2 | 7 | 0.1Sr0.15Ba | 0.05La0.1Eu0.2Yb | 0.15Ga0.15In |
| 204 | 0.95 | 0.1 | 8 | 0.05Ca0.1Sr0.15Ba | 0.05La0.1Eu0.2Yb | 0.15Ga0.15In |
| 205 | 0.95 | 0.2 | 8 | 0.05Ca0.1Sr0.15Ba | 0.05La0.1Eu0.2Yb | 0.15Ga0.15In |
| 206 | 0.95 | 0.3 | 8 | 0.05Ca0.1Sr0.15Ba | 0.05La0.1Eu0.2Yb | 0.15Ga0.15In |
| 207 | 0.95 | 0.4 | 8 | 0.05Ca0.1Sr0.15Ba | 0.05La0.1Eu0.2Yb | 0.15Ga0.15In |

| Sample No. | Transition metal D(t) | κ | ZT | Composition (1) | Composition (2) |
|---|---|---|---|---|---|
| 176 | — | 2.955 | 1.14 | 1.1, 1.3, 1.6, 1.9, 1.10 | — |
| 177 | — | 3.026 | 1.11 | 1.1, 1.2, 1.6, 1.8, 1.9, 1.10 | — |
| 178 | — | 3.107 | 1.23 | 1.1, 1.2, 1.6, 1.8, 1.9 | — |
| 179 | — | 3.565 | 1.03 | — | — |
| 180 | — | 3.582 | 1.03 | 1.1, 1.3, 1.9, 1.10 | — |
| 181 | — | 3.509 | 1.10 | 1.1, 1.2, 1.9 | — |
| 182 | — | 3.747 | 0.98 | — | — |
| 183 | — | 3.823 | 0.98 | — | — |
| 184 | — | 3.921 | 1.01 | — | — |
| 185 | — | 4.624 | 0.67 | — | — |
| 186 | — | 4.614 | 0.80 | — | — |
| 187 | — | 4.286 | 0.87 | — | — |
| 188 | — | 2.53 | 1.00 | — | — |
| 189 | — | 2.57 | 1.41 | 1.1, 1.2, 1.5, 1.6, 1.9, 1.10 | 2.1, 2.3 |
| 190 | — | 2.59 | 1.37 | 1.1, 1.2, 1.5, 1.6, 1.9, 1.10 | 2.1, 2.3 |
| 191 | — | 2.54 | 1.40 | 1.1, 1.2, 1.5, 1.6, 1.9, 1.10 | 2.1, 2.3 |
| 192 | — | 2.42 | 1.41 | 1.1, 1.2, 1.5, 1.6, 1.9, 1,10 | 2.1, 2.3 |
| 193 | — | 3.17 | 1.24 | 1.1, 1.2, 1.5, 1.6, 1.9, 1.10 | 2.1, 2.3 |
| 194 | — | 2.89 | 1.22 | 1.1, 1.2, 1.5, 1.6, 1.9, 1.10 | 2.1, 2.3 |
| 195 | — | 2.69 | 1.29 | 1.1, 1.2, 1.5, 1.6, 1.9, 1.10 | 2.1, 2.3 |
| 196 | — | 2.55 | 1.39 | 1.1, 1.2, 1.5, 1.6, 1.9, 1.10 | 2.1, 2.3 |
| 197 | — | 2.53 | 1.38 | 1.1, 1.2, 1.5, 1.6, 1.9, 1.10 | 2.1, 2.3 |

TABLE 6-continued

| | | | | |
|---|---|---|---|---|
| 198 — | 2.84 | 0.61 | — | — |
| 199 — | 3.51 | 0.95 | — | — |
| 200 — | 3.01 | 0.89 | — | — |
| 201 — | 3.26 | 1.23 | 1.1, 1.2, 1.5, 1.6, 1.9, 1.10 | 2.2 |
| 202 — | 3.08 | 1.20 | 1.1, 1.2, 1.5, 1.6, 1.9, 1.10 | 2.2 |
| 203 — | 2.91 | 1.42 | 1.1, 1.2, 1.5, 1.6, 1.9, 1.10 | 2.2 |
| 204 — | 2.96 | 1.28 | 1.1, 1.2, 1.5, 1.6, 1.7, 1.9, 1.10 | 2.2 |
| 205 — | 2.79 | 1.33 | 1.1, 1.2, 1.5, 1.6, 1.7, 1.9, 1.10 | 2.2 |
| 206 — | 2.74 | 1.25 | 1.1, 1.2, 1.5, 1.6, 1.7, 1.9, 1.10 | 2.2 |
| 207 — | 2.62 | 1.27 | 1.1, 1.2, 1.5, 1.6, 1.7, 1.9, 1.10 | 2.2 |

[1.3.1. Number of Filling Elements]

In general, many of the n-type filled skutterudite-based compositions which reportedly have high performance are triple-filled skutterudite-based ones in which the amount y of Fe substitution is y=0, the amount x of the filling element is x<0.3, and the number of the kinds of the filling elements R is three. For example, Non-patent Literature 6 reports a very high ZT value (ZT=1.65) for a composition which contains Ba, La and Yb, and satisfies x=0.2 and y=0.

To this end, a sample having the same composition (amount x of the filling elements x=0.2, amount y of Fe substitution y=0, filling elements $R=Ba_{0.1}La_{0.05}Yb_{0.05}$) as that in Non-patent Literature 6 was produced first. However, performance only equivalent to ZT=about 0.9 could be achieved (see Comparative Example 1 (double circle) in FIG. 2 and sample No. 1 in Table 1).

Figure 2:
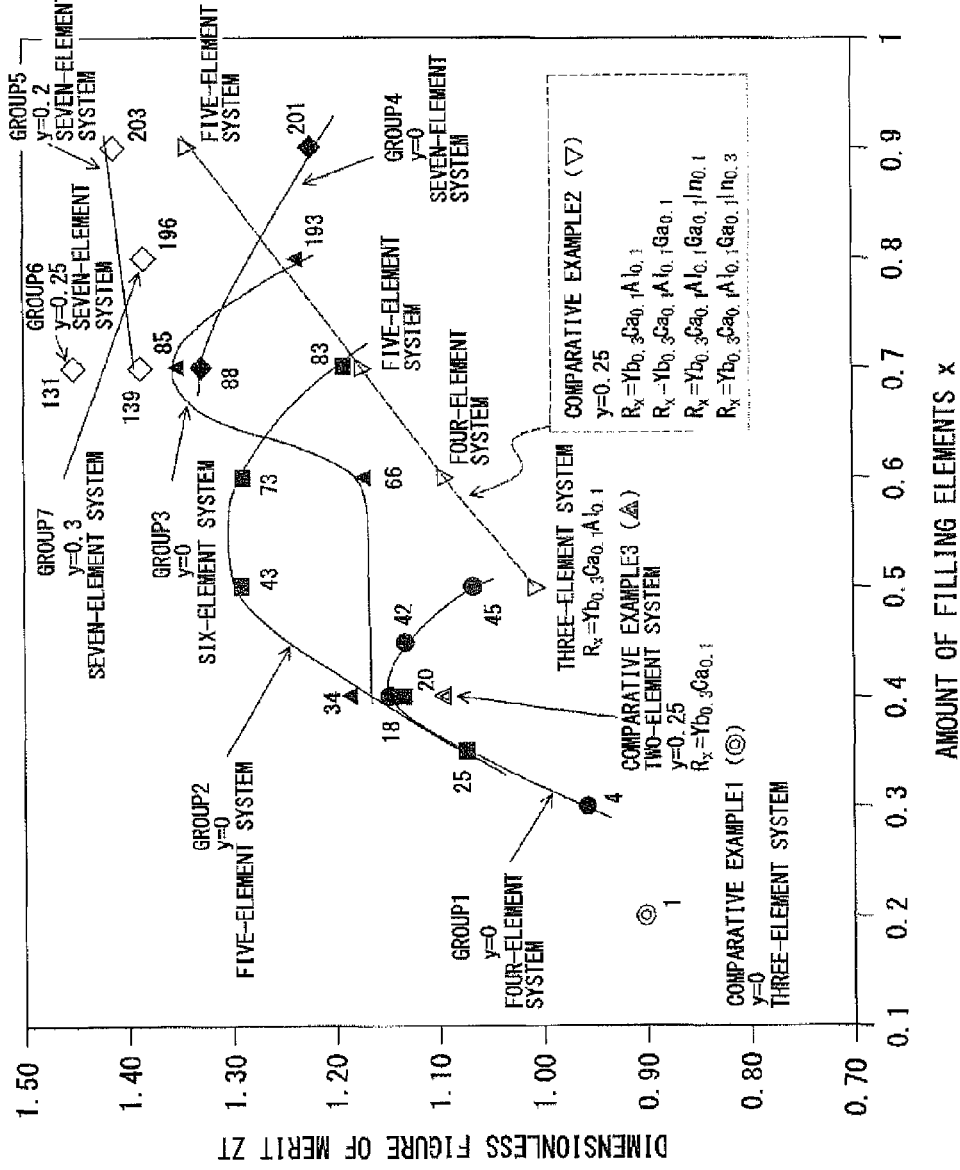
FIG. 2 is a drawing which shows the influence of the amount x of the filling element on the dimensionless figure of merit ZT of $R_x Co_{4-y} Fe_y Sb_{12}$.

It should be noted that the numbers in FIG. 2 represents sample numbers. The same applies to FIGS. 1, 3 and 4.

Comparing the data of Non-patent Literature 6 and our data, our samples had lower electric conductivities σ, and higher thermal conductivities κ. It was thought that in order to achieve the improvement in the electric conductivity σ and reduction in the thermal conductivity κ, an increase in the amount x of filling elements was effective.

However, as shown in Non-patent Literature 6, the amount of elements which can occupy the vacancy sites of the skutterudite-based material is limited, and a single kind of the filling element R cannot occupy all the vacancy sites that exist in a crystal. For example, in skutterudite represented by $\square_xCo_4Sb_{12}$ ($\square$ represents a vacancy site), vacancy sites exist at a ratio represented by x=1.0. However, a single kind of the filling element R cannot actually occupy all the vacancy sites.

To this end, in order to increase the solid solubility limit of the filling elements R, vacancy sites are substituted with multiple kinds of filling elements R. However, in an n-type skutterudite-based material, the number of kinds of the filling elements R reported is mostly three or less.

We selected four to seven elements as filling elements R and adjusted the total amount x of the filling elements R, so that the filling elements R properly would occupy the vacancy sites even when x was increased. The selected elements include basically Ba, La, Yb and In, and further include one or more element selected from the group consisting of Eu, Al and Ga.

As a result, the following tendency was confirmed. That is, the thermoelectric property was affected by the difference in the number of filling elements. However, as x increased, the electric conductivity σ improved, and the amount of reduction in the thermal conductivity κ by the rattling effect increased, and therefore ZT value was improved (see groups 1 to 7 in FIGS. 1 and 2). As a result, it was revealed that the compositions having high x could achieve higher performance compared to the composition of Comparative Example 1 (sample No. 1).

In FIGS. 1 and 2, the tendency was confirmed that, compared to 4-element systems (group 1), as the number of filling elements increased, the lattice thermal conductivity $κ_{ph}$ further decreased, and the ZT value also improved. It was found that in order to improve the thermoelectric property, the kinds of filling elements is preferably five or more, and more preferably six or more. This tendency became particularly noticeable when x was increased.

Moreover, as mentioned above, in general, the kinds of the filling elements R are three or less in many cases, but there are some, though not many, reports of systems where four or more elements are substituted. For example, Patent Literature 4 reports 3- to 5-element system materials in which x=0.5, 0.6, 0.7 or 0.9, y=0.25, Ca and Yb are contained as the filling elements R, and Al, Ga and/or In are further added to this (Comparative Example 2 indicated by the broken line in FIG. 2). The tendency can also be confirmed in Comparative Example 2 that the ZT value increases as the amount x of the filling element increases. However, Patent Literatures 4 does not specify what kind of combination of filling elements R is effective in improving performance.

In addition, Patent Literatures 3 discloses a 2-element system composition in which x=0.4 and y=0.25, and Ca and Yb are contained (see Comparative Example 3 in FIG. 2).

However, y=0.25 is fixed in these Comparative Examples 2 to 3, and it is not known which range of the amount y of Fe substitution allows the highest ZT value.

We examined the influence that the values of x and y, and the kind of filling elements R had on the thermoelectric property in detail. As a result, we found that when compared with the amount x of the filling elements being the same, there were compositions having improved ZT values compared to Comparative Examples 2 to 3 in compositions having the following composition:

(a) at least Ba, Yb and In are contained as the filling elements R,
(b) additional elements are further added to make the number of filling elements to four or higher (when x<0.7), or five or higher (when 0.7≤x), and
(c) the amount y of Fe substitution has been appropriately adjusted.

For example, in the case of the composition in which x=0.4 to 0.6 in FIG. 2, ZT of group 1 to group 3 (y=0, 4- to 6-element systems) are all higher than those of Comparative Examples 2 and 3 (y=0.25, 2- to 4-element systems).

Moreover, comparing groups 5 to 7 (y>0, 7-element system) and group 4 (y=0, 7-element system) in FIG. 2, it can be seen that, even when the amounts x of the filling elements are the same, the composition y>0 can improve the ZT value better than the composition y=0.

As for the composition x=0.7, Comparative Example 2 (y=0.25, 5-element system) has been reported. In contrast, in the composition x=0.7 of group 2 (y=0, 5-element system), ZT is only slightly higher than that of the composition x=0.7 of Comparative Example 2.

However, it can be seen that, if x=0.7, when the kinds of filling elements is increased to six or more (groups 3, 4), the ZT value can be improved much better than Comparative Example 2 even with the composition y=0. In addition, in group 6 (y=0.25, 7-element system), the ZT value has been clearly improved compared to Comparative Example 2, confirming the effectiveness of increasing the number of filling elements.

Figure 3:
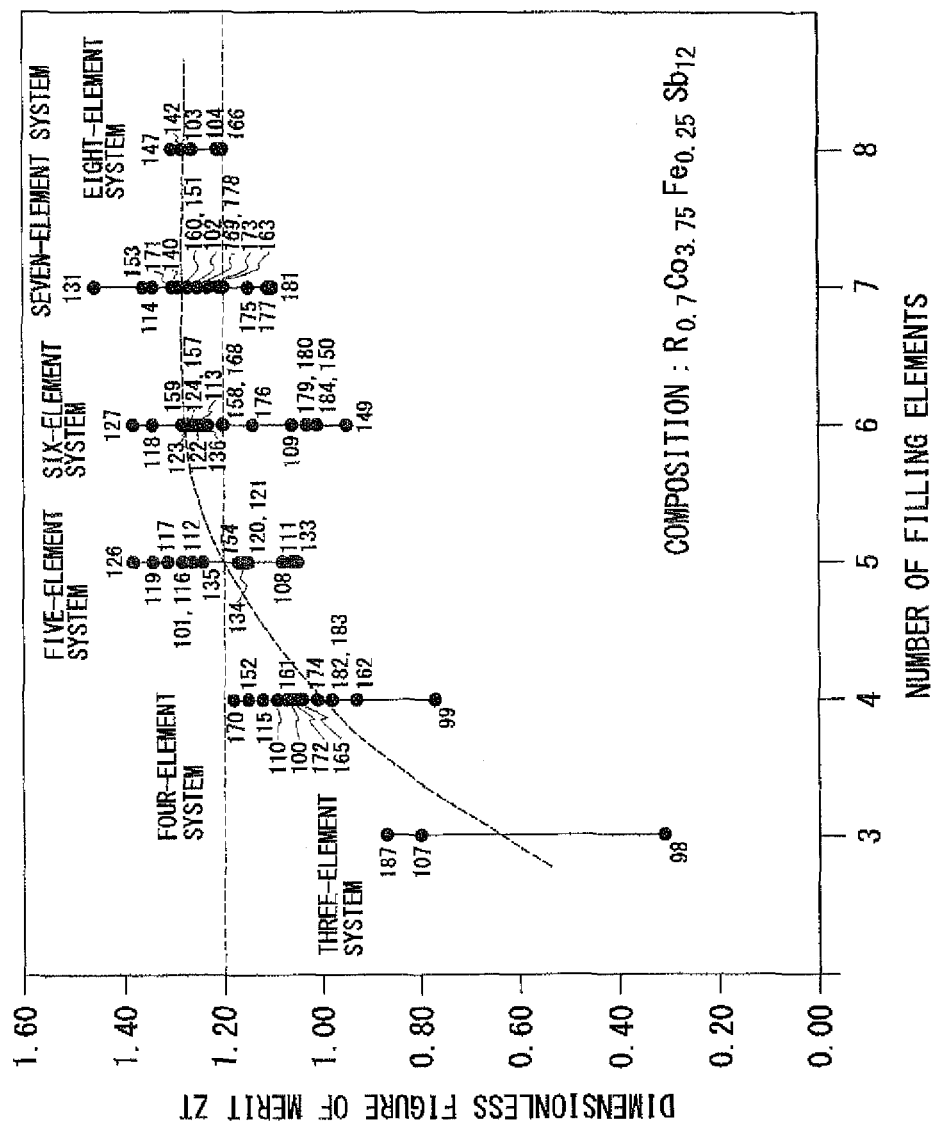
FIG. 3 is a drawing which shows the influence of the number of the filling elements on the dimensionless figure of merit ZT of $R_x Co_{4-y} Fe_y Sb_{12}$.
Figure 4:
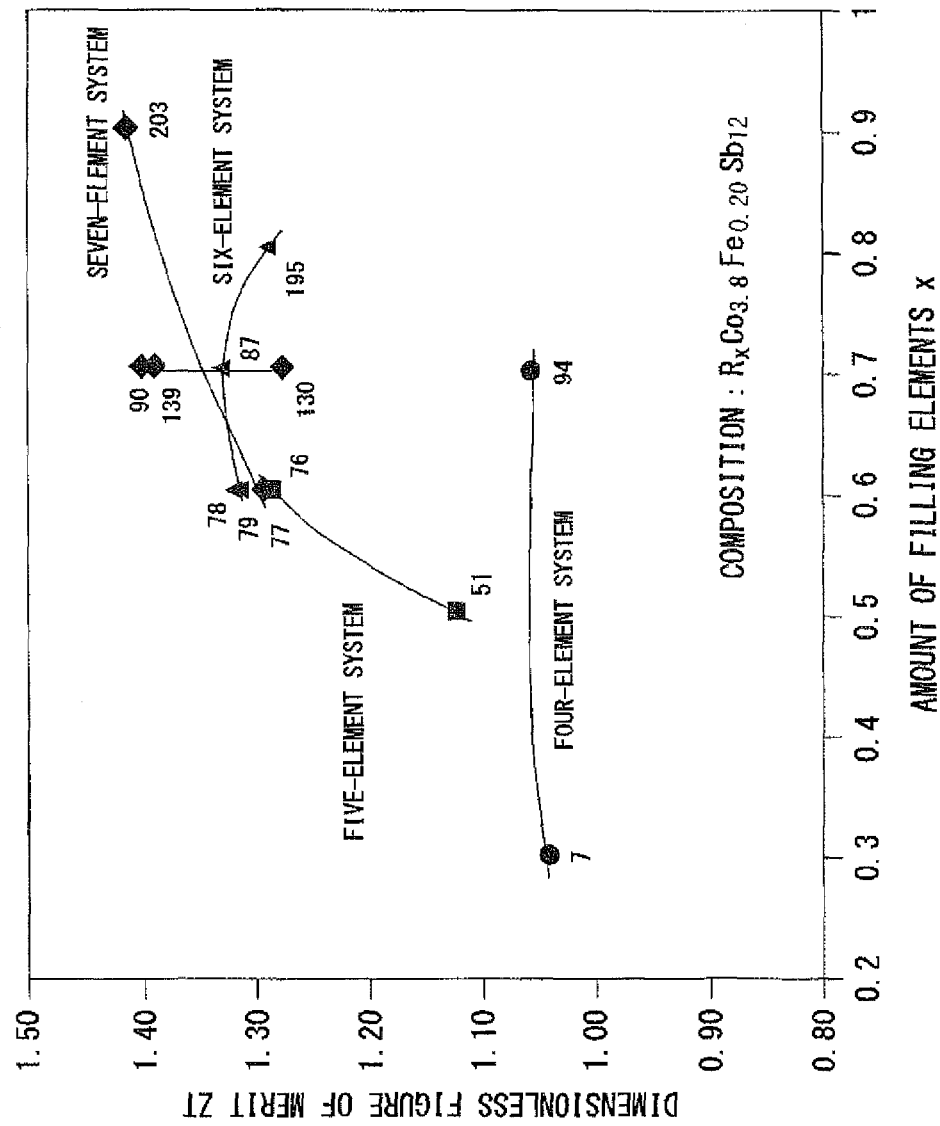
FIG. 4 is a drawing which shows the influence of the amount x of the filling element on the dimensionless figure of merit ZT of $R_x Co_{4-y} Fe_y Sb_{12}$.

Similarly, in FIGS. 3 and 4, the tendency was confirmed that the ZT value is improved as the number of the filling elements increased.

Moreover, the composition x=0.9 of group 4 (y=0, 7-element system) has a lower ZT value than the composition x=0.9 of Comparative Example 2. However, in the composition x=0.9, it was found that when some of Co sites were substituted with Fe as in group 5 (y=0.2, 7-element systems), ZT values higher than those of comparative example 2 could be obtained even in 7-element systems.

It can also be seen from FIGS. 6 to 8 described later that when x=0.9 and in the 7-element-system composition, the ZT value increases towards y=0.2. See samples Nos. 201 to 203 of Table 6.

In general, the values of the electric conductivity σ and Seebeck coefficient S depend on the concentration of the carrier, and the carrier component of the thermal conductivity κ also increases as the concentration of the carrier increases. Accordingly, these values cannot be controlled independently and there exists the optimal carrier concentration at which ZT value becomes the highest. In this system, when the amount of the filling elements R as electron dopants is increased, the concentration of the carrier increases. Meanwhile, when some of the Co sites is substituted with Fe as a hole dopant, the concentration of the carrier decreases. Therefore, the concentration of the carrier can be controlled by adjusting the values of x and y appropriately.

Figure 6:
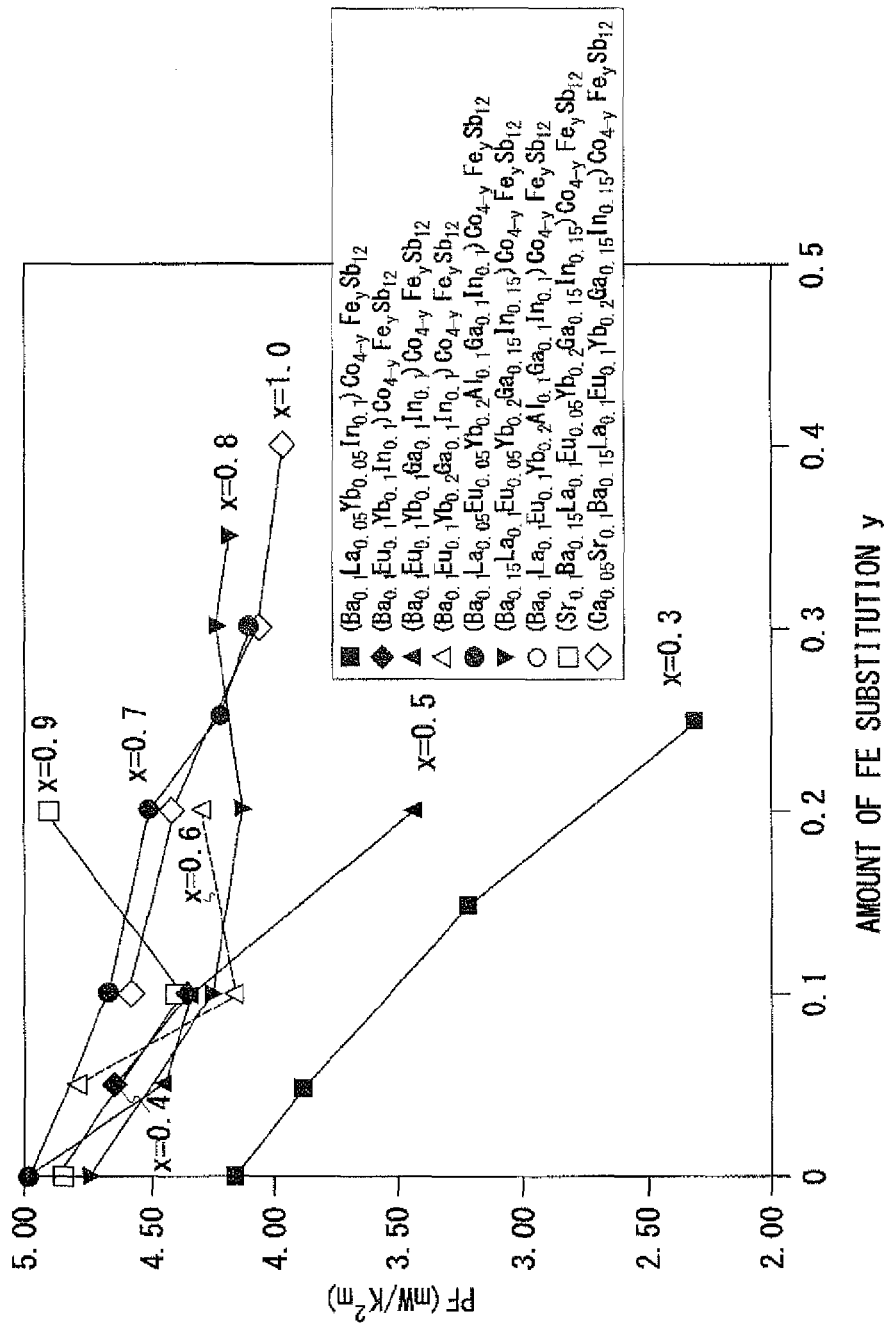
FIG. 6 is a drawing which shows the influence of the amount x of the filling element and the amount y of Fe substitution on the power factor PF of $R_x Co_{4-y} Fe_y Sb_{12}$.
Figure 7:
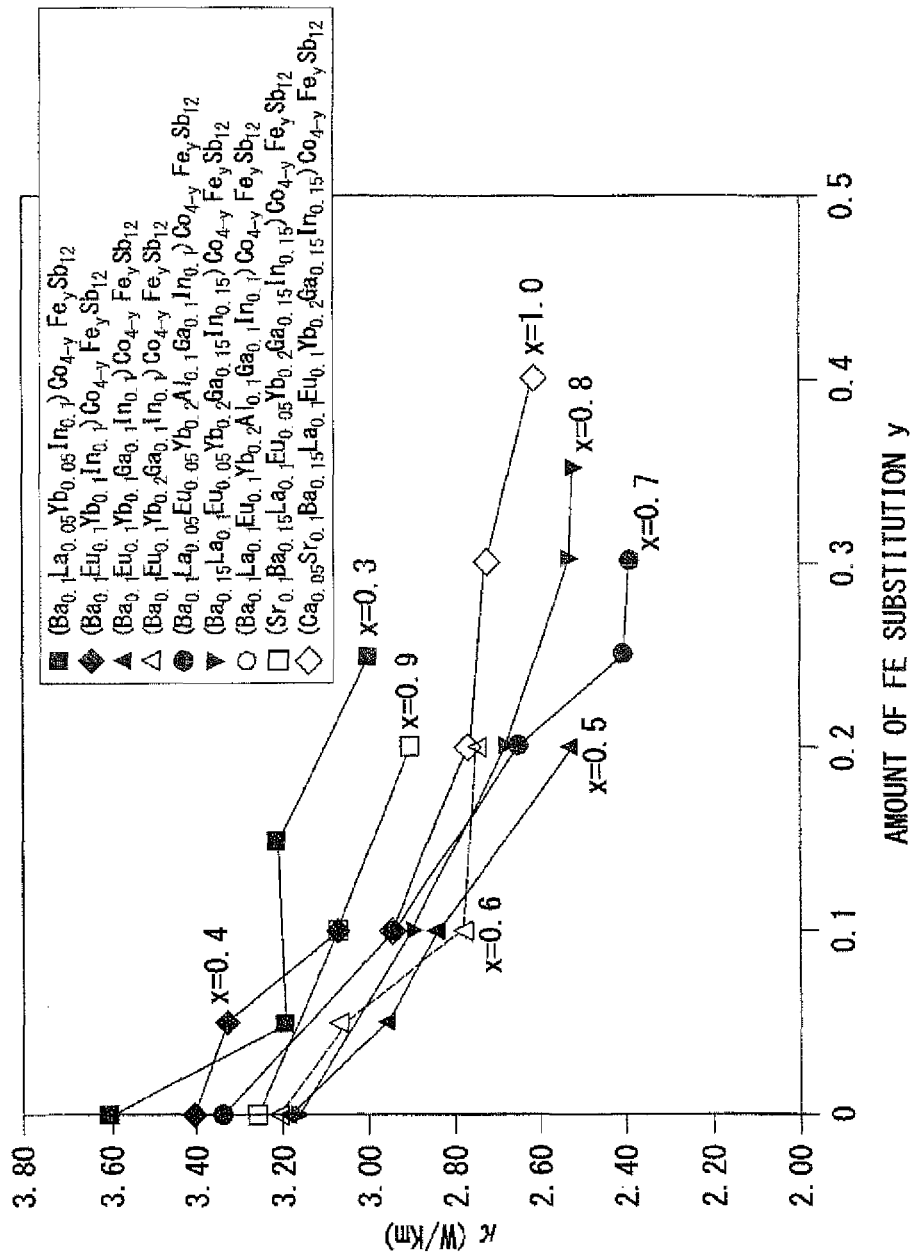
FIG. 7 is a drawing which shows the influence of the amount x of the filling element and the amount y of Fe substitution on the thermal conductivity κ of $R_x Co_{4-y} Fe_y Sb_{12}$.
Figure 8:
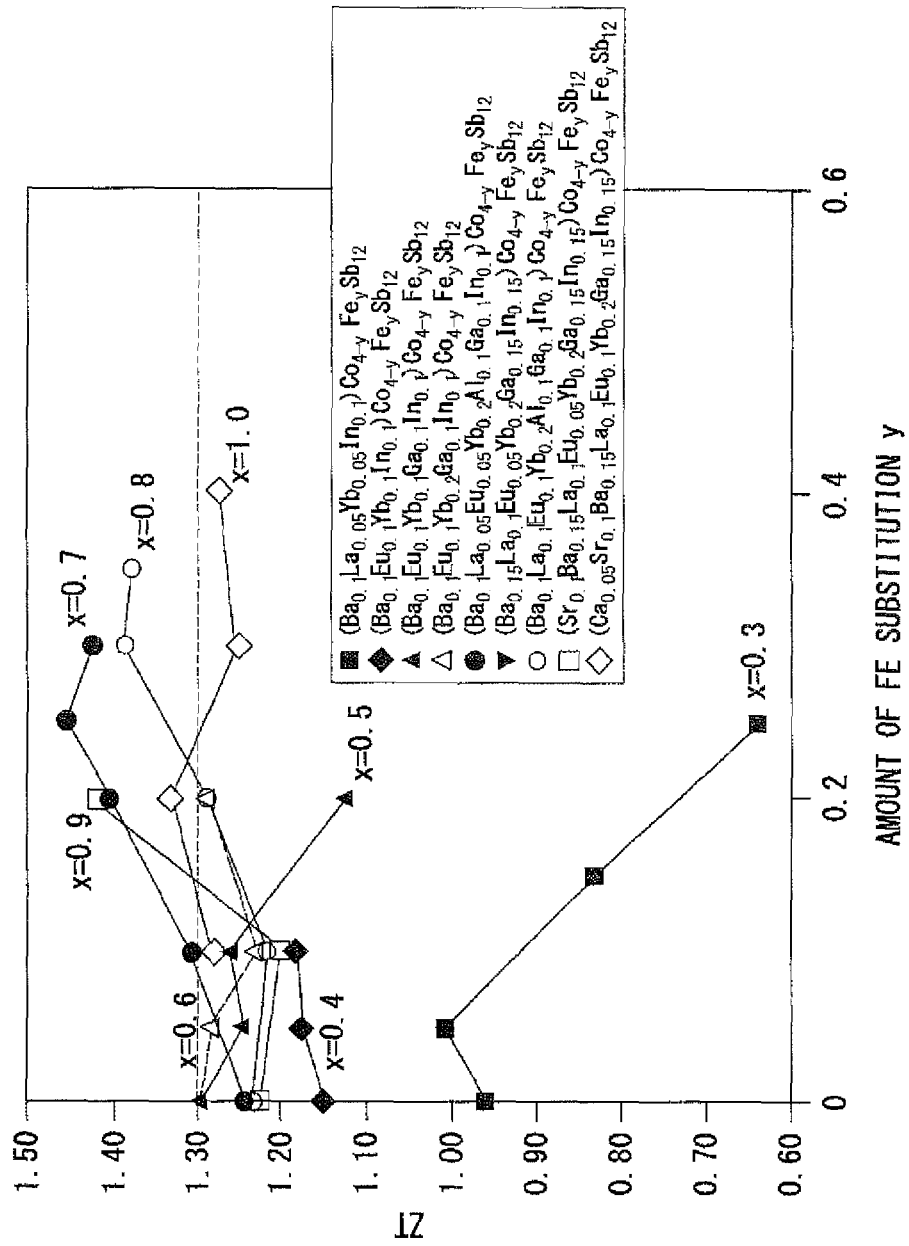
FIG. 8 is a drawing which shows the influence of the amount x of the filling element and the amount y of Fe substitution on the dimensionless figure of merit ZT of $R_x Co_{4-y} Fe_y Sb_{12}$.

FIGS. 6 to 8 show how the power factor PF, thermal conductivity κ, and ZT values change when the amount y of Fe substitution and the amount x of filling elements are adjusted to control the concentration of the carrier. The tendency was found that the power factor PF increased with the increase in x in general, and decreased with the increase in y.

The tendency was found that the thermal conductivity κ decreased with the increase in x when x was 0.5 or less, while the thermal conductivity κ was almost constant even if x increased when x was greater than 0.5. Meanwhile, the tendency was found that the thermal conductivity κ decreased with the increase in y.

As a result, the tendency was found that, at a certain value y, the improvement in the power factor PF and the decrease in the thermal conductivity κ are offset, and the ZT value becomes the highest.

The tendency was also confirmed that the value of y at which the ZT value became the highest increases as x increased. For example, in composition x=0.6, the ZT value becomes highest near the composition y=0 to 0.05. Meanwhile, in the composition x=0.7, the ZT value becomes highest near the composition y=0.2 to 0.3. In particular, in the composition x=0.7, it was found that the composition near y=0.25 improved the ZT value to about 1.5. As shown in FIG. 4, the tendency was also confirmed in this composition range that the ZT values were improved with the increase in the number of the filling elements.

[1.3.2. Kinds and Amounts of Filling Elements]

The following shows the results of more detailed examination on how the kinds and amounts of the filling elements R affect the thermoelectric property.

[A. Substitution with Elements Belonging to the Same Group]

First, cases where any one kind of alkaline earth metal elements, rare earth elements or group IIIB elements is contained will be described.

With respect to the substitution only with alkaline earth metal elements, compositions of samples Nos. 39 to 41, 60 to 62, 80 to 82 and 185 to 187 in Tables 1 to 6 were compared and examined.

In any of the compositions, the ZT values of the compositions containing three kinds of elements: Ba, Ca and Sr are higher than those of the compositions which contain Ba only. However, in these compositions, the ZT values were not improved even when x>0.4. That is, it was found that the sufficient amount "a" of substitution with an alkaline earth metal element was 0.5 or lower, and preferably 0.4 or lower.

With respect to the substitution only with rare earth elements, the compositions of samples Nos. 35 to 38, 53 to 58, 67 to 72, 105 to 109, and 198 to 200 in Tables 1 to 6 were compared and examined.

The tendency was found that when the amount x of the filling elements and the amount y of Fe substitution were the same, the electric conductivity σ was lower than in the abovementioned alkaline earth metal element system, but the thermal conductivity κ also decreased, and therefore ZT increased. Moreover, the tendency could be confirmed that, compared to the case of the substitution only with Yb, Eu substitution increased the electric conductivity σ, and La substitution reduced the thermal conductivity κ.

However, with the composition x=0.5, compositions substituted only with Yb indicated a relatively high ZT value. That is, in the substitution only with rare earth elements, the improvement effect of the ZT value by the substitution with several kinds of rare earth elements was not significant.

In contrast, when the amount of substitution was increased to x=0.8, the ZT value of the compositions substituted only with Yb decreased dramatically, while the ZT values of the compositions substituted with two or more kinds of rare earth elements improved. However, when x=0.8, the ZT values themselves are low even if multiple elements are introduced.

With respect to the substitution only with group IIIB elements, the compositions of samples Nos. 9 to 16, 47, 48 and 98 were compared and examined. Also in this case, as in the alkaline earth metal element system and rare earth element system, the ZT values decreased when the amounts x of filling elements increased. Also in this system, the effect of improving the ZT values by the substitution with multiple kinds of group IIIB elements was not found when the amount x to filling elements was low.

The cases of transition metal elements are as follows.

That is, when a rare earth element was added to the composition of sample No. 4, the thermal conductivity κ decreased, and the ZT value improved for any rare earth element, regardless of the kind.

In contrast, when a transition metal element was added to the composition of sample No. 4, if the transition metal element was Cu, the thermal conductivity κ increases on the contrary, and the ZT value was lowered. In contrast, when Zn was added, the thermal conductivity κ decreased to a similar degree as other rare earth elements without adversely affecting the electric conductivity σ, and the ZT value therefore improved. This suggests that Zn also substitutes vacancy sites, and the thermal conductivity κ is improved by the rattling effect as well as rare earth elements.

Moreover, in the case where some of rare earth elements were substituted with Ti, high ZT values of 1.2 or higher are also maintained. Since transition metal elements have low prices compared with rare earth elements, there is a merit of cost reduction.

Thus, the compositions containing only elements belonging to the same group did not indicate the advantage of substituting with multiple elements. In contrast, when elements belonging to different groups such as the alkaline earth metal elements, rare earth elements and group IIIB elements, and further certain kinds of transition metal elements were used in combination, the ZT values clearly improved compared to the case of substitution only with elements belonging to the same group. In addition, it was found that the ZT values are further improved by substituting with elements belonging to different groups and simultaneously with elements belonging to the same group.

[B. Substitution with Elements Belonging to Different Groups]

Below, with an example of the composition: $(A_a B_b C_c)$ $Co_{3.75}Fe_{0.25}Sb_{12}$ (A: alkaline earth metal element, B: rare earth element, C: group IIIB element, x=a+b+c=0.7) of x=0.7, y=0.25 and t=0 having an especially high ZT value, the advantages of the substitution with elements belonging to different groups will be described.

Figure 9:
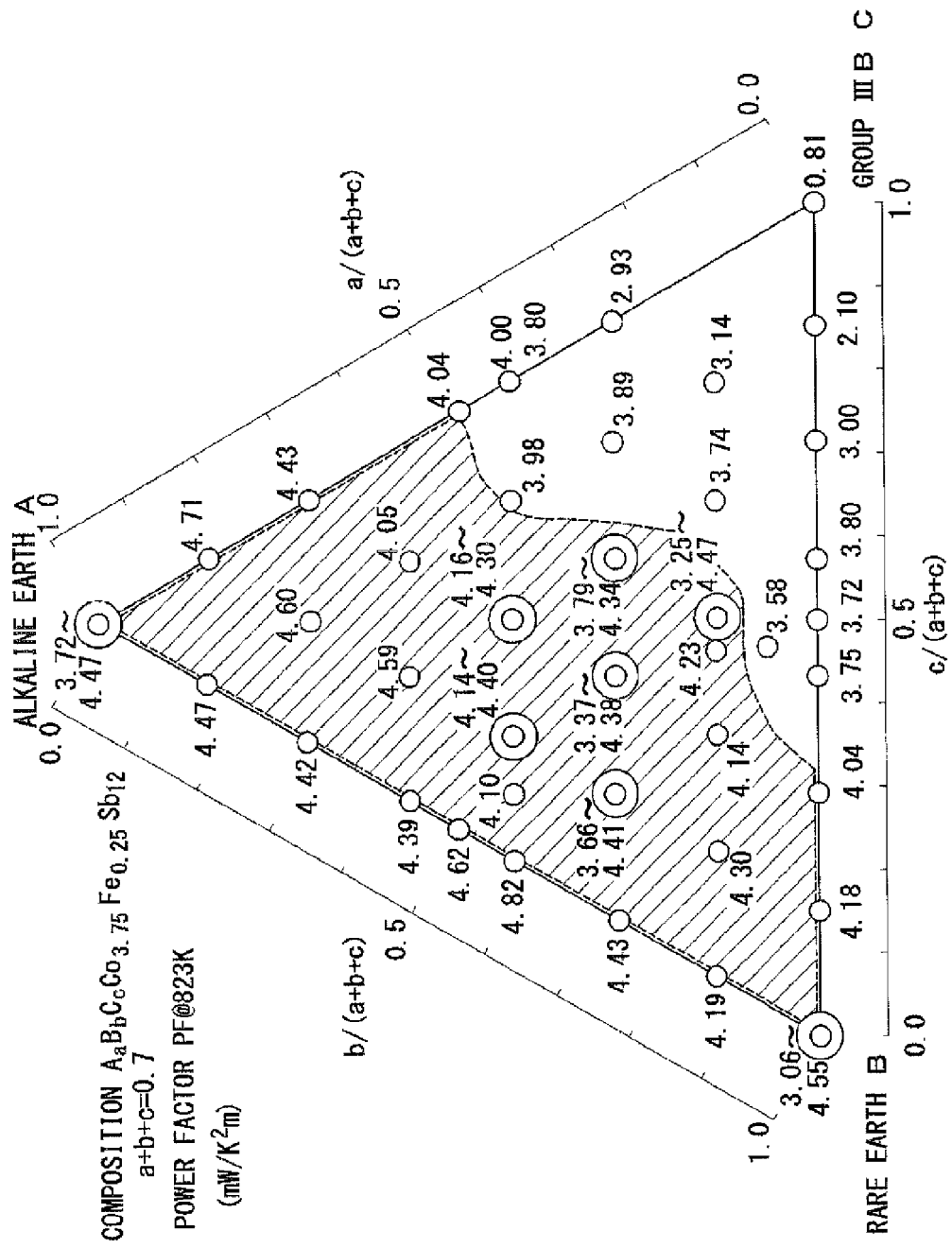
FIG. 9 is a drawing which shows the relationship between the composition of $R_x Co_{4-y} Fe_y Sb_{12}$ and power factor PF.
Figure 10:
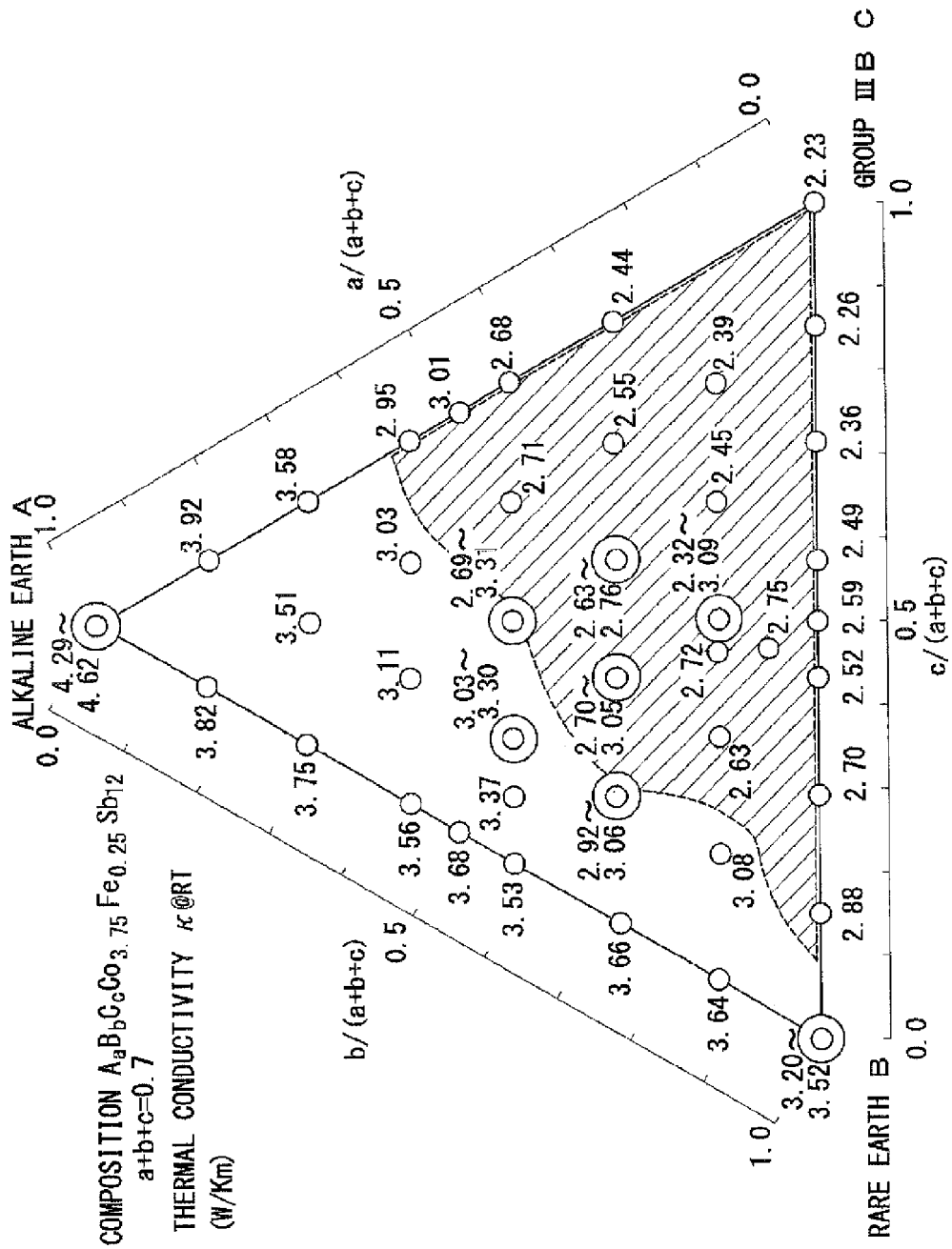
FIG. 10 is a drawing which shows the relationship between the composition of $R_x Co_{4-y} Fe_y Sb_{12}$ and thermal conductivity κ.

FIGS. 9 to 11 show the composition dependence of the power factor PF, thermal conductivity κ, and ZT value on the abovementioned compositions (samples Nos. 95 to 127, 131, 133 to 136, 140, 142 to 155, 158 to 187).

These characteristics changed depending on the kind and ratio (values of a, b and c) of the filling elements R (alkaline earth metal element A, rare earth element B, and group IIIB element C).

Generally, the tendency was found that when alkaline earth metal elements increased, the power factor PF increased and the thermal conductivity κ decreased slightly or increased in some cases. Moreover, the tendency was found that when the group IIIB elements increased, the power factor PF was lowered, but the thermal conductivity κ was reduced as well. In the area indicated by the broken line in FIG. 11, it was found that the decrease in the thermal conductivity κ and improvement in the power factor PF were optimized, and high ZT values (ZT≥1.2) were realized. Furthermore, the performance of ZT≥1.3 was obtained in the area in the dotted line in FIG. 11.

[C. Amount of Substitution]

With respect to the ranges of the amounts of substitution a, b, c and t, the following was found out:

When the filling elements R are only group IIIB elements, the thermal conductivity κ becomes low, but the power factor PF is low as well. Therefore, the performance remained in ZT=about 0.3.

On the contrary, when no group IIIB element was contained as the filling elements R, reduction in the thermal conductivity κ was insufficient. Therefore, in the compositions which contained no group IIIB element, no composition in which the ZT value exceeded 1.2 was found.

Therefore, in order to achieve high performance, group IIIB elements are essential. In the composition containing group IIIB elements in the range of 0<c≤0.5, preferably of 0<c≤0.4, and further having alkaline earth metal elements and/or rare earth elements in appropriate amounts, the power factor PF improved. Moreover, it was found that the ZT value became 1.2 or higher by such a composition.

The group IIIB element is preferably In. Meanwhile, the ZT value decreased in the composition which contains only Al as the group IIIB element.

For example, comparing samples Nos. 119 to 123 and 131, high ZT values can be realized by the composition which contains In alone as the group IIIB element. Moreover, it is found that in the composition containing three kinds of elements in which part of In was substituted with Al and Ga, the ZT value is higher.

However, the tendency was found that when Al was contained alone as the group IIIB element, or when the amount of substitution of Al exceeded 0.1, the ZT value decreased.

When Ba was contained alone as the alkaline earth metal element, the ZT value was about 1 in the range of a>0.3, irrespective of the existence of rare earth elements and group IIIB elements.

Meanwhile, when three kinds (Ca, Sr, Ba) of alkaline earth metal elements were contained, there was a composition which allowed the performance of ZT=about 1.2 even when a=0.3. However, the tendency was found that if "a" was increased even higher, the ZT value lowered.

However, in the case of the composition which contains three kinds of alkaline earth metal elements, and further contains a rare earth element and an group IIIB element, it was found that with the optimal composition, performance of ZT=about 1.2 could be obtained even when a=0.4 (sample No. 178).

Moreover, in the case where a composition which contained no alkaline earth metal elements but contained three or more kinds of group IIIB elements and two or more kinds of rare earth elements (the total number of elements: five or more), the composition allowed the performance of ZT>1.2. For example, see samples Nos. 101 to 104, etc.

As mentioned above, it was found that the number of the alkaline earth metal elements was preferably one or more kinds, and more preferably three or more. It was also found that the content "a" of the alkaline earth metal elements was preferably 0≤a≤0.5, and more preferably 0≤a≤0.4.

A high ZT value was obtained in a composition containing Yb alone as the rare earth element. Meanwhile, when Yb was completely substituted with Eu, the ZT value decreased (samples Nos. 126→No. 125).

Moreover, for example, comparing samples Nos. 126, 127, 131, 140, and 142 to 144, the followings can be understood.

That is, when Yb was partially substituted with other elements and the number of rare earth elements was three or lower, the tendency was confirmed that the ZT value was improved. Meanwhile, when the number of rare earth elements was higher than three, remarkable effect of improving the ZT value was not confirmed.

With respect to the amount "b" of substitution with the rare earth elements, even in the case where b=0, when each of the number of alkaline earth metal elements and group IIIB elements was three or more (the total number of elements was six or more), the performance of ZT≥1.2 was obtained (sample No. 168).

Moreover, even when b=0.6, there was a composition which allowed high performance of ZT=1.21 (sample No. 104).

With respect to the amount "t" of substitution with transition metal elements, the following was found out:

For example, the ZT value was comparable when part of elements (t=0.05) of sample No. 118 was substituted with Ti (sample No. 114). In contrast, when it was substituted with Ti to t=0.1 (sample No. 113), the ZT value lowered. This shows that a small amount of Ti substitution (t≤0.1) has the same effects as the rare earth element substitution. Therefore, the improvement in performance can be realized while reducing the used amount of the expensive and precious rare earth elements.

The above results showed that the composition containing two or more rare earth elements as the filling elements R and in which 0≤b≤0.7, preferably 0≤b≤0.6 was preferable.

Moreover, comparing these samples, it was found that the performance of ZT≥1.3 was realized in those compositions which had the number of filling elements, which was the sum of the number of alkaline earth metal elements, rare earth elements and group IIIB elements, was five or more.

Therefore, it was found that, in order to realize a high ZT value, it was necessary that:
(a) 0<a≤0.5 (preferably, 0<a≤0.4),
(b) 0≤b≤0.7 (preferably, 0≤b≤0.6),
(c) 0<c≤0.5 (preferably, 0<c≤0.4),
(d) 0≤t≤0.1, and,
(e) as the filling elements R, at least four or more kinds of elements (preferably, one or more kinds of alkaline earth metal elements, two or more kinds of rare earth elements and one or more kinds of group IIIB elements) are contained.

Moreover, it was found that, in order to realize a high ZT value, it was preferable to contain, as the filling elements R, five or more kinds of elements.

As have been explained, in a composition containing Ba, Yb and In as filling elements R, it was found that it was effective in improving thermoelectric properties to substitute some of those elements with multiple other filling elements, or to optimize x and y.

Moreover, for example, among the rare earth elements, Eu is effective in improving the electric conductivity σ (power factor PF), and can improve the power factor PF by partially substituting Yb. Meanwhile, partial substitution of the Yb with La is effective in reducing the thermal conductivity κ.

Accordingly, when part of Yb is simultaneously substituted with these La and Eu having different effects, the thermoelectric property can be further improved.

[1.3.3. Ionic Radius]

In order to clarify how the kind of the above sated filling elements R for partial substitution influences on the thermoelectric property (power factor PF and thermal conductivity κ), elements having different ionic radii were added as the filling elements R, and changes in the thermoelectric properties were compared and examined. The results will be described below.

The composition prepared by adding $In_{0.1}$ to the composition of Non-patent Literature 6, that is, $R_0=Ba_{0.1}La_{0.05}Yb_{0.05}In_{0.1}$ (x=0.3) was used as a base composition, and 0.1 of various additional filling elements X having different ionic radii were added to this to make x=0.4 $[R_0X_{0.1}]$. In this case, it was found that the difference in the additional filling elements X affected the thermoelectric properties (see FIG. 5).

The tendency was found that the decreasing rate of the thermal conductivity κ became greater as the elements X with smaller ionic radii were charged. Even when any of the elements X was added, the ZT value improved compared to the base composition.

Meanwhile, no remarkable correlation was observed between the value of the power factor PF and the ionic radii. However, compared to the base composition, the tendency was found that the electric conductivity σ increased, and the power factor PF remained almost the same or increased. It was found that in the compositions containing these elements X, the power factor PF was higher than the composition of X=Yb except for composition of X=Ga.

Figure 5:
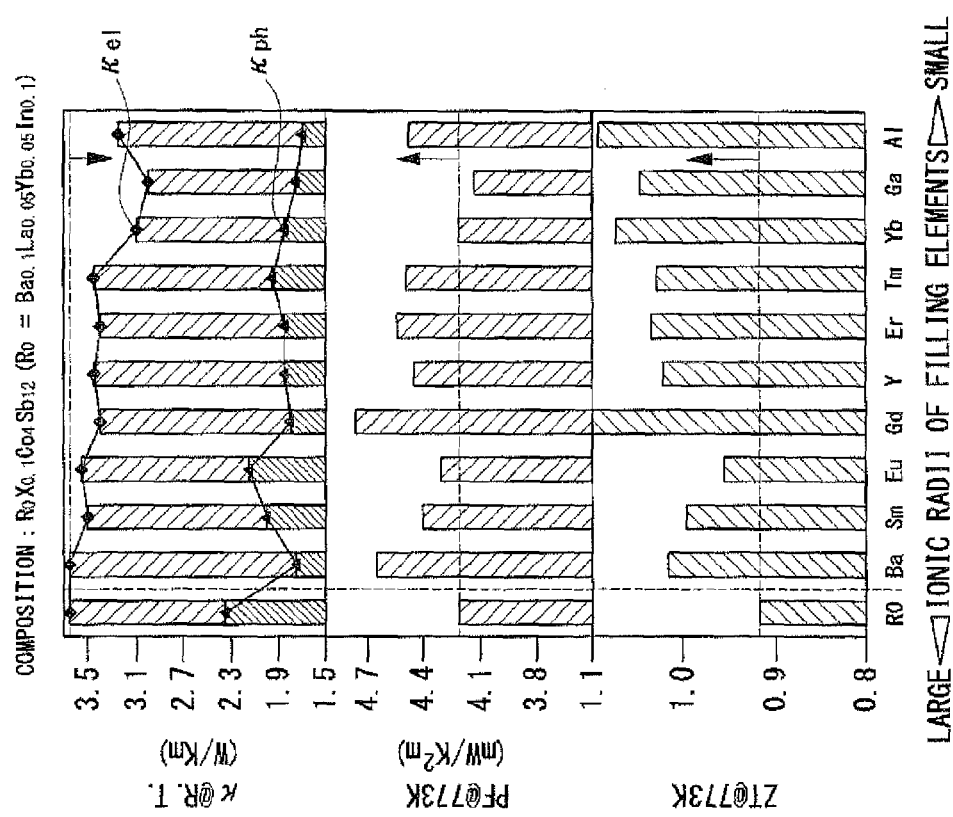
FIG. 5 is a drawing which shows the influence of the ionic radius of the filling element X on the thermal conductivity κ, power factor PF, and dimensionless figure of merit ZT of $R_0 X_{0.1} Co_4 Sb_{12}$ ($R_0 = Ba_{0.1} La_{0.05} Yb_{0.05} In_{0.1}$)

From the results stated above, for example, it is expected to be effective in improving thermoelectric properties to perform simultaneous substitution of part of Yb with elements highly effective in reducing the thermal conductivity κ and having small ionic radii (for example, Al, Ga, etc.) and elements in FIG. 5 (in this case, excluding Ga) having effects in improving the power factor PF.

However, when elements occupy the vacancy sites in a crystal structure, matching of the vacancy sizes and the ionic sizes of the occupying elements is important. In order to increase the amount of reduction of the thermal conductivity κ, substitution with group IIIB elements having small ionic radii is effective. However, as mentioned above, the ionic radius of Al is too small and its degree of solid solution is not high. Therefore, when Al is added alone and the amount of substitution is excessively increased, performance is lowered on the contrary. Therefore, it is necessary for thermoelectric property improvement to combine these elements suitably.

Although the embodiments of the present invention have been described above in detail, the present invention is not particularly limited to the above-described embodiments, and various modifications can be made unless the gist of the present invention is not deviated.

The n-type thermoelectric material according to the present invention can be applied to various thermoelectric power generators such as solar thermoelectric generator, sea water temperature difference thermoelectric power generator, fossil fuel thermoelectric power generator, and regenerative power generator of factory exhaust heat and automotive exhaust heat; precision temperature control units used in photon-detection device, laser diode, field effect transistor, photo-multiplier, cell of spectrum photometer, and column of chromatography; and constant-temperature unit, air-conditioning and heating equipment, refrigerator, and power source of clocks.

What is claimed is:

1. An n-type thermoelectric material comprising the following constitutions (1) to (2):
   (1) the n-type thermoelectric material having a composition represented by the formula (X) below:

   $$(A_aB_bC_cD_t)Co_{4-y}Fe_ySb_{12} \qquad (X)$$

wherein 0≤a≤0.5, 0≤b≤0.7, 0<c≤0.5, 0≤t≤0.1, a+b+c+t=x, 0.4≤x≤1.0, 0≤y≤0.5, a+b>0,
   the element A (filling element A) is one or more elements selected from the group consisting of Mg, Ca, Sr and Ba,
   the element B (filling element B) is one or more elements selected from the group consisting of Y, Sc and La to Lu,
   the element C (filling element C) is one or more elements selected from the group consisting of Al, Ga and In,
   the element D (filling element D) is Zn and/or Ti, and the $A_aB_bC_cD_t(=R_x)$ satisfying formula (Y) below:

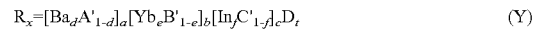
   $$R_x=[Ba_dA'_{1-d}]_a[Yb_eB'_{1-e}]_b[In_fC'_{1-f}]_cD_t \qquad (Y)$$

wherein 0<d≤1, 0≤e≤1, 0<f≤1, ad+be>0,
   the element A' is the filling element A other than Ba,
   the element B' is the filling element B other than Yb, and
   the element C' is the filling element C other than In; and
   (2) the n-type thermoelectric material containing five or more kinds in total of the filling elements A to D.

2. The n-type thermoelectric material according to claim 1, which contains two or more kinds of filling elements selected from the group consisting of the element A, the element B and the element C.

3. The n-type thermoelectric material according to claim 1, which further satisfies $0 < b \leq 0.6$ and $0.1 \leq be \leq 0.5$.

4. The n-type thermoelectric material according to claim 1,
wherein $b=0$, $a>0$, $c>0$, $ad>0$, and $cf>0$ are further satisfied,
the element A' contains Ca and/or Sr, and
the element C' contains Al and/or Ga.

5. The n-type thermoelectric material according to claim 1, which further satisfies $0.2 \leq b \leq 0.3$ and $e > 0$, and contains one or more element as the element B'.

6. The n-type thermoelectric material according to claim 1, which further satisfies $0.3 < b \leq 0.6$ and $e > 0$, and contains two or more kinds of elements as the element B'.

7. The n-type thermoelectric material according to claim 1, which further satisfies $0 < a \leq 0.4$.

8. The n-type thermoelectric material according to claim 1, which further satisfies $0.3 \leq a < 0.4$ and $0.1 \leq ad \leq 0.2$, and contains Ca and Sr as the element A'.

9. The n-type thermoelectric material according to claim 1, which further satisfies $a=0.4$, $b>0$, $c>0$ and $0.1 \leq ad \leq 0.2$, and contains Ca and Sr as the element A'.

10. The n-type thermoelectric material according to claim 1, which further satisfies $0.1 \leq c \leq 0.4$.

11. The n-type thermoelectric material according to claim 1,
wherein $0.2 \leq c \leq 0.4$ is further satisfied,
$C = In_f Ga_g Al_{1-f-g}$, and
$0 < cg \leq 0.2$ and $0 \leq (1-f-g)$ are satisfied.

12. An n-type thermoelectric material comprising the following constitutions (1') to (2'):

(1') the n-type thermoelectric material having a composition represented by formula (X') below:

(X') $(A_a B_b C_c D_t)Co_{4-y}Fe_y Sb_{12}$
wherein $0.1 \leq a \leq 0.3$, $0.1 \leq b \leq 0.6$, $0.1 \leq c \leq 0.4$, $0 \leq t \leq 0.1$, $a+b+c+t=x$, $0.5 \leq x \leq 1.0$, $0 \leq y \leq 0.4$,
the element A (the filling element A) is one or more elements selected from the group consisting of Ca, Sr and Ba,
the element B (the filling element B) is one or more elements selected from the group consisting of Y, Sc and La to Lu,
the element C (the filling element C) is one or more elements selected from the group consisting of Al, Ga and In,
the element D (the filling element D) is Zn and/or Ti, and
the $A_a B_b C_c D_t (=R_x)$ satisfying formula (Y') below:

$$R_x = [Ba_d A'_{1-d}]_a [Yb_e B'_{1-e}]_b [In_f Ga_g Al_{1-f-g}]_c D_t \quad (Y')$$

wherein $0.1 \leq ad \leq 0.2$, $0.1 \leq be \leq 0.3$, $0 < f < 1$, $0 \leq cg \leq 0.15$, $f+g \leq 1$,
the element A' is the filling element A other than Ba, and
the element B' is the filling element B other than Yb; and (2') the n-type thermoelectric material containing six or more kinds in total of the filling elements A to D.

13. The n-type thermoelectric material according to claim 12, which further satisfies $0.7 \leq x < 0.9$ and $0 \leq y \leq 0.35$.

14. The n-type thermoelectric material according to claim 12, which further satisfies $0.9 \leq x$ and $0 \leq y \leq 0.4$, and contains seven or more kinds in total of the filling elements A to D.

15. The n-type thermoelectric material according to claim 12, which further satisfies $0.1 \leq a \leq 0.2$, $0.2 \leq b \leq 0.5$ and $0.2 \leq c \leq 0.4$, and contains at least Ba, Yb, Eu, La, In and Ga as the filling elements A to D, and further contains Al if necessary.

16. The n-type thermoelectric material according to claim 1, which has a dimensionless figure of merit (ZT) value of 1.3 or higher at 823 K.

17. The n-type thermoelectric material according to claim 12, which has a dimensionless figure of merit (ZT) value of 1.3 or higher at 823 K.

* * * * *

UNITED STATES PATENT AND TRADEMARK OFFICE
CERTIFICATE OF CORRECTION

PATENT NO. : 9,478,724 B2
APPLICATION NO. : 14/584864
DATED : October 25, 2016
INVENTOR(S) : Masato Matsubara et al.

Page 1 of 1

It is certified that error appears in the above-identified patent and that said Letters Patent is hereby corrected as shown below:

In the Claims

In Column 37, Line 40, "$0 \leq (1-f-g) \leq 0.1$" should be --$0 \leq (1-f-g) \, c \leq 0.1$--.

Signed and Sealed this
Seventeenth Day of January, 2017

Michelle K. Lee
*Director of the United States Patent and Trademark Office*